United States Patent
Cheng et al.

(10) Patent No.: US 11,811,013 B2
(45) Date of Patent: Nov. 7, 2023

(54) DISPLAY PANEL

(71) Applicant: Au Optronics Corporation, Hsinchu (TW)

(72) Inventors: Chun-Cheng Cheng, Hsinchu (TW); Chan-Jui Liu, Hsinchu (TW); Seok-Lyul Lee, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 143 days.

(21) Appl. No.: 17/516,708

(22) Filed: Nov. 2, 2021

(65) Prior Publication Data

US 2022/0328743 A1 Oct. 13, 2022

(30) Foreign Application Priority Data

Apr. 9, 2021 (TW) .................................. 110112869

(51) Int. Cl.
*H01L 33/64* (2010.01)
*H01L 25/16* (2023.01)
*H01L 27/12* (2006.01)

(52) U.S. Cl.
CPC .......... *H01L 33/644* (2013.01); *H01L 25/167* (2013.01); *H01L 27/1248* (2013.01); *H01L 33/641* (2013.01)

(58) Field of Classification Search
None
See application file for complete search history.

(56) References Cited

U.S. PATENT DOCUMENTS

| | | | |
|---|---|---|---|
| 2008/0210965 A1 | 9/2008 | Hung | |
| 2020/0312831 A1 | 10/2020 | He et al. | |
| 2022/0393075 A1* | 12/2022 | Li | ........................... H01L 33/46 |

FOREIGN PATENT DOCUMENTS

| | | |
|---|---|---|
| CN | 109449177 | 3/2019 |
| CN | 109859647 | 6/2019 |
| CN | 111477649 | 7/2020 |
| CN | 111477653 | 7/2020 |
| TW | 200818539 | 4/2008 |
| TW | 201937713 | 9/2019 |
| TW | 201943066 | 11/2019 |

OTHER PUBLICATIONS

Pro-Design Nails (QD),_2019 (Year: 2019).*

* cited by examiner

*Primary Examiner* — Bo B Jang
(74) *Attorney, Agent, or Firm* — JCIPRNET

(57) ABSTRACT

A display panel includes a drive element, a first heat dissipation layer, a light-emitting element, and a second heat dissipation layer. The drive element is disposed on a substrate. The first heat dissipation layer is disposed on the drive element. The light-emitting element is disposed on the first heat dissipation layer and electrically connected to the drive element. The second heat dissipation layer covers the light-emitting element. A refractive index of the first heat dissipation layer is greater than a refractive index of the second heat dissipation layer when a light-emitting surface of the light-emitting element faces the first heat dissipation layer, and the refractive index of the second heat dissipation layer is greater than the refractive index of the first heat dissipation layer when the light-emitting surface of the light-emitting element faces the second heat dissipation layer.

8 Claims, 24 Drawing Sheets

DISPLAY PANEL

CROSS-REFERENCE TO RELATED APPLICATION

This application claims the priority benefit of Taiwan application serial no. 110112869, filed on Apr. 9, 2021. The entirety of the above-mentioned patent application is hereby incorporated by reference herein and made a part of this specification.

BACKGROUND OF THE INVENTION

Field of the Invention

The invention relates to a display panel, and particularly relates to a light-emitting diode display panel.

Description of Related Art

Generally, external quantum efficiency (EQE) is used to express the light-emitting efficiency of a light-emitting element in a display panel, wherein the EQE is defined as the ratio of the number of electrons generated by the light-emitting element to the number of photons incident on the light-emitting element. The EQE is reduced as the temperature of the light-emitting element is increased during operation. Therefore, if the operating temperature of the light-emitting element may be lowered during operation, the light-emitting efficiency of the light-emitting element may be improved.

SUMMARY OF THE INVENTION

The invention provides a display panel, wherein a light-emitting element has improved light-emitting efficiency.

A display panel of the invention includes a drive element, a first heat dissipation layer, a light-emitting element, and a second heat dissipation layer. The drive element is disposed on a substrate. The first heat dissipation layer is disposed on the drive element. The light-emitting element is disposed on the first heat dissipation layer and electrically connected to the drive element. The second heat dissipation layer covers the light-emitting element. A refractive index of the first heat dissipation layer is greater than a refractive index of the second heat dissipation layer when a light-emitting surface of the light-emitting element faces the first heat dissipation layer, and the refractive index of the second heat dissipation layer is greater than the refractive index of the first heat dissipation layer when the light-emitting surface of the light-emitting element faces the second heat dissipation layer.

In an embodiment of the invention, the refractive index of the first heat dissipation layer and the refractive index of the second heat dissipation layer are between 1.5 and 2.3.

In an embodiment of the invention, the refractive index of the first heat dissipation layer is 1.8 to 2.3 and the refractive index of the second heat dissipation layer is 1.5 to 1.8 when the light-emitting surface of the light-emitting element faces the first heat dissipation layer, and the refractive index of the first heat dissipation layer is 1.5 to 1.8 and the refractive index of the second heat dissipation layer is 1.8 to 2.3 when the light-emitting surface of the light-emitting element faces the second heat dissipation layer.

In an embodiment of the invention, a coefficient of thermal conductivity of the first heat dissipation layer and a coefficient of thermal conductivity of the second heat dissipation layer are greater than one.

In an embodiment of the invention, the coefficient of thermal conductivity of the first heat dissipation layer is greater than the coefficient of thermal conductivity of the second heat dissipation layer when the light-emitting surface of the light-emitting element faces the first heat dissipation layer, and the coefficient of thermal conductivity of the second heat dissipation layer is greater than the coefficient of thermal conductivity of the first heat dissipation layer when the light-emitting surface of the light-emitting element faces the second heat dissipation layer.

In an embodiment of the invention, the first heat dissipation layer and the second heat dissipation layer include a plurality of microparticles, and the plurality of microparticles include $Al_2O_3$, $TiO_2$, or a combination thereof.

In an embodiment of the invention, a density of the plurality of microparticles included in the first heat dissipation layer is greater than a density of the plurality of microparticles included in the second heat dissipation layer when the light-emitting surface of the light-emitting element faces the first heat dissipation layer, and the density of the plurality of microparticles included in the second heat dissipation layer is greater than the density of the plurality of microparticles included in the first heat dissipation layer when the light-emitting surface of the light-emitting element faces the second heat dissipation layer.

In an embodiment of the invention, the display panel further includes a first insulating layer, a second insulating layer, a third insulating layer, and a fourth insulating layer. The first insulating layer is disposed on the substrate and partially covers the drive element. The second insulating layer is disposed on the first heat dissipation layer, wherein the first heat dissipation layer is covered by a structure formed by the first insulating layer and the second insulating layer. The third insulating layer is disposed on the second insulating layer. The fourth insulating layer is disposed on the third insulating layer and covers the second heat dissipation layer.

In an embodiment of the invention, the second heat dissipation layer is covered by a structure formed by the third insulating layer and the fourth insulating layer.

In an embodiment of the invention, a driver chip is disposed on the fourth insulating layer and electrically connected to the drive element when the light-emitting surface of the light-emitting element faces the first heat dissipation layer.

Based on the above, in the display panel of the invention, the light-emitting element is disposed between the first heat dissipation layer and the second heat dissipation layer, and the relative relationship of the refractive indices of the heat dissipation layers are changed with the facing direction of the light-emitting surface of the light-emitting element. In this way, the heat generated by the light-emitting element during operation may be quickly dissipated to reduce the temperature of the light-emitting element, so as to achieve the effect of increasing external quantum efficiency, thereby improving the light-emitting efficiency of the light-emitting element.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1H are schematic cross-sectional views of a manufacturing method of a display panel of the first embodiment of the invention.

Figure 1A:
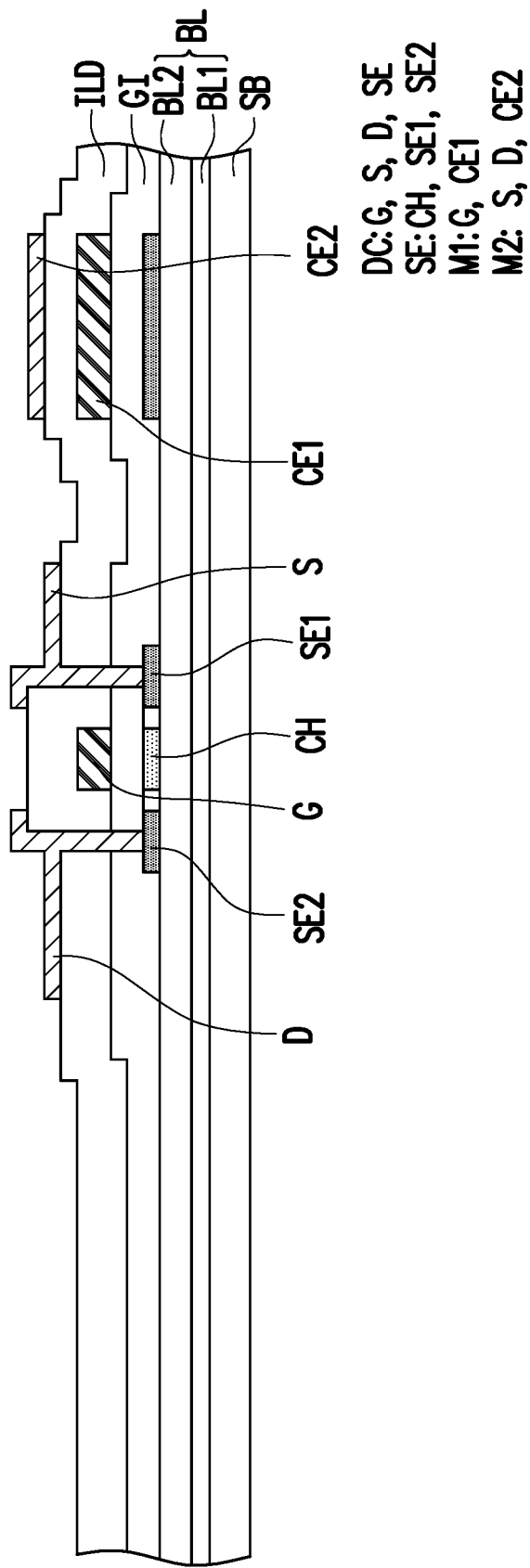
FIG. 1A to FIG. 1H are schematic cross-sectional views of a manufacturing method of a display panel of the first embodiment of the invention.

Referring to FIG. 1A, a drive element DC is formed on a substrate SB. In some embodiments, the substrate SB may be a flexible substrate, and may be a polymer substrate or a plastic substrate, but the invention is not limited thereto. In other embodiments, the substrate SB may also be, for example, a rigid substrate, and may be a glass substrate, a quartz substrate, or a silicon substrate. The drive element DC may include, for example, an active element, a passive element, or a combination thereof, and the invention is not limited thereto. In the present embodiment, a drive element DC including an active element is exemplified. In some embodiments, the steps of forming the drive element DC on the substrate SB may be as follows, but it should be noted that the invention is not limited thereto.

First, a semiconductor layer SE is formed on the substrate SB. The semiconductor layer SE is formed by, for example, a lithography process. For example, a physical vapor deposition method or a metal chemical vapor deposition method may be used to form a semiconductor material layer (not shown) on the substrate SB first. Next, a patterned photoresist layer (not shown) is formed on the semiconductor material layer. Then, using the patterned photoresist layer as a mask, an etching process is performed on the semiconductor material layer to form the semiconductor layer SE. The material of the semiconductor layer SE may be, for example, amorphous silicon, but the invention is not limited thereto. The material of the semiconductor layer SE may also be, for example, polycrystalline silicon, microcrystalline silicon, monocrystalline silicon, nanocrystalline silicon, or other semiconductor materials or metal oxide semiconductor materials having different lattice arrangements. In the present embodiment, the semiconductor layer SE includes a channel region CH and doped regions SE1 and SE2 respectively located at two sides of the channel region CH.

In addition, before the semiconductor layer SE is formed on the substrate SB, for example, a buffer layer BL may be formed on the substrate SB first, so that the buffer layer BL is located between the semiconductor layer SE and the substrate SB. The buffer layer BL is formed by, for example, a physical vapor deposition method or a chemical vapor deposition method. In some embodiments, the material of the buffer layer BL may be silicon oxide, silicon nitride, or stacked layers of the above two materials, and the invention is not limited thereto. In the present embodiment, the buffer layer BL includes stacked layers of a first buffer layer BL1 made of silicon nitride and a second buffer layer BL2 made of silicon oxide.

Next, a gate dielectric layer GI is formed on the substrate SB, wherein the gate dielectric layer GI covers the semiconductor layer SE. The method of forming the gate dielectric layer GI is, for example, by using a physical vapor deposition method or a chemical vapor deposition method. In the present embodiment, the material of the gate insulating layer GI may be an inorganic material (for example: silicon oxide, silicon nitride, silicon oxynitride, or stacked layers of at least two of the above materials), an organic material (for example, polyimide resin, epoxy resin, or acrylic resin), or a combination thereof, but the invention is not limited thereto. The gate dielectric layer GI may be a single-layer structure, but the invention is not limited thereto. In other embodiments, the gate dielectric layer GI may also be a multilayer structure.

Next, a first metal layer M1 is formed on the gate dielectric layer GI. The first metal layer M1 is formed by, for example, using a physical vapor deposition method or a chemical vapor deposition method and then performing a lithography process. For example, a physical vapor deposition method or a chemical vapor deposition method may be used to form a first metal material layer (not shown) on the substrate SB first. Next, a patterned photoresist layer (not shown) is formed on the first metal material layer. Then, using the patterned photoresist layer as a mask, an etching process is performed on the first metal material layer to form the first metal layer M1. In some embodiments, the first metal layer M1 includes a gate G and a first storage electrode CE1, but the invention is not limited thereto. For example, the first metal layer M1 may further include scan lines (not shown), common voltage lines (not shown), and common voltage supply lines (not shown). The gate G is, for example, connected to the corresponding scan line to receive the corresponding gate voltage. The first storage electrode CE1 is connected to a first common voltage supply line to receive a corresponding common voltage. That is, the first common voltage supply line may be used, for example, to transmit a common voltage supplied from a common voltage line (not shown) to provide a common voltage to the first storage electrode CE1.

Then, an interlayer dielectric ILD is formed on the gate dielectric layer GI, wherein the interlayer dielectric ILD covers the first metal layer M1. The method of forming the interlayer dielectric GI is, for example, by using a physical vapor deposition method or a chemical vapor deposition method. In the present embodiment, the material of the interlayer dielectric ILD may be an inorganic material (for example: silicon oxide, silicon nitride, silicon oxynitride, or stacked layers of at least two of the above materials), an organic material (for example, polyimide resin, epoxy resin, or acrylic resin), or a combination thereof, but the invention is not limited thereto. The interlayer dielectric ILD may be a single-layer structure, but the invention is not limited thereto. In other embodiments, the interlayer dielectric ILD may also be a multilayer structure. Moreover, the interlayer dielectric ILD of the present embodiment includes openings respectively exposing a portion of the doped regions SE1 and SE2 of the semiconductor layer SE, so that a subsequently formed source S and drain D may be electrically connected to the semiconductor layer SE via the openings.

Then, a second metal layer M2 is formed on the interlayer dielectric ILD. The second metal layer M2 is formed by, for example, using a physical vapor deposition method or a chemical vapor deposition method and then performing a lithography process. For example, a physical vapor deposition method or a chemical vapor deposition method may be used to form a second metal material layer (not shown) on the substrate SB first. Next, a patterned photoresist layer (not shown) is formed on the second metal material layer. Then, using the patterned photoresist layer as a mask, an etching process is performed on the second metal material layer to form the second metal layer M2. In some embodiments, the second metal layer M2 includes the source S, the drain D, and a second storage electrode CE2, but the invention is not limited thereto. For example, the second metal layer M2 may also include data lines (not shown). The source S is, for example, connected to the corresponding data line to receive the corresponding data voltage. The drain D is, for example, electrically connected to the second storage electrode SE2, so that the second storage electrode CE2 also receives the corresponding data voltage. In the present embodiment, the second storage electrode CE2 may form a storage capacitor with the first storage electrode CE1 and the interlayer dielectric ILD sandwiched therebetween, but the invention is not limited thereto. In the present embodiment, the gate G, the semiconductor layer SE, the source S, and the drain D may form the drive element DC. It is worth mentioning that, in the present embodiment, the drive element DC includes any top-gate thin-film transistor known to those with ordinary knowledge in the art, but the invention is not limited thereto. In other embodiments, the drive element DC may also include a bottom-gate type thin-film transistor or other suitable types of thin-film transistors.

Figure 1B:
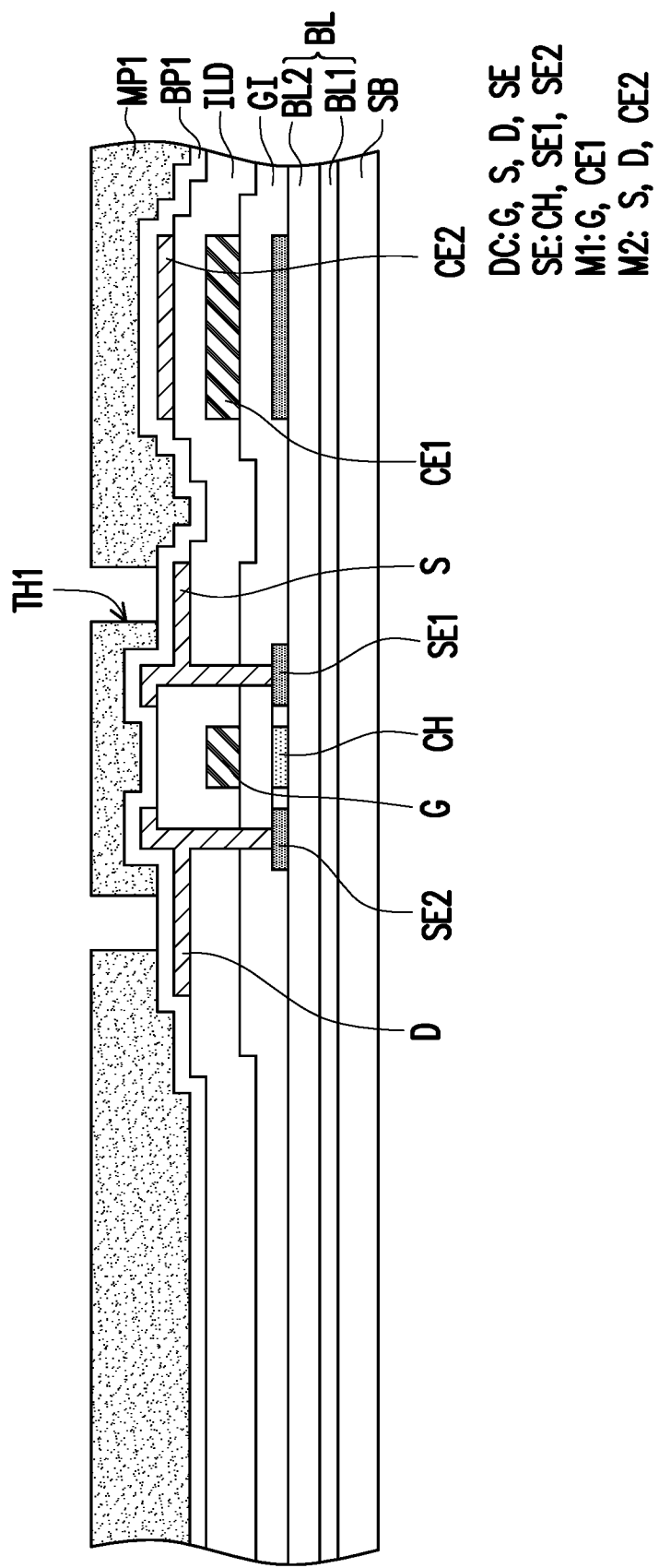

Referring to FIG. 1B, a first insulating layer BP1 is formed on the interlayer dielectric ILD, wherein the first insulating layer BP1 covers the second metal layer M2. In some embodiments, the first insulating layer BP1 is formed by using a physical vapor deposition method or a chemical vapor deposition method. In the present embodiment, the material of the first insulating layer BP1 includes an inorganic material, and may be silicon oxide, silicon nitride, silicon oxynitride, or stacked layers of at least two of the above materials, but the invention is not limited thereto. The first insulating layer BP1 may be a single-layer structure, but the invention is not limited thereto. In other embodiments, the first insulating layer BP1 may also be a multilayer structure.

Referring to FIG. 1B, a first heat dissipation layer MP1 is formed on the first insulating layer BP1, wherein the first heat dissipation layer MP1 includes a plurality of through holes TH1 exposing a portion of the first insulating layer BP1. The first heat dissipation layer MP1 has the characteristics of high thermal conductivity. In the present embodiment, the material of the first heat dissipation layer MP1 is an oxide including a plurality of microparticles, and includes $Al_2O_3$, $TiO_2$, or a combination thereof. In some embodiments, the coefficient of thermal conductivity of the first heat dissipation layer MP1 is at least greater than 1 W/(m·K). In a preferred embodiment, the coefficient of thermal conductivity of the first heat dissipation layer MP1 is 4.8 W/(m·K) to 70 W/(m·K). For example, $Al_2O_3$ has a thermal conductivity of about 10 W/(m·K) to 70 W/(m·K), and $TiO_2$ has a thermal conductivity of about 4.8 W/(m·K) to 9 W/(m·K). In the present embodiment, the first heat dissipation layer MP1 faces the light-emitting surface of the light-emitting element to be formed later (the refractive index of the material included is about 2.3). Accordingly, the refractive index of the first heat dissipation layer MP1 is preferably 1.8 to 2.3, so as to achieve refractive index matching with the light-emitting element and have the effect of high transmittance. It should be mentioned that, the material of the first heat dissipation layer MP1 is not limited to $Al_2O_3$ or $TiO_2$. Other materials with a coefficient of thermal conductivity and refractive index meeting the above ranges may also be selected as the material of the first heat dissipation layer MP1.

Figure 1C:
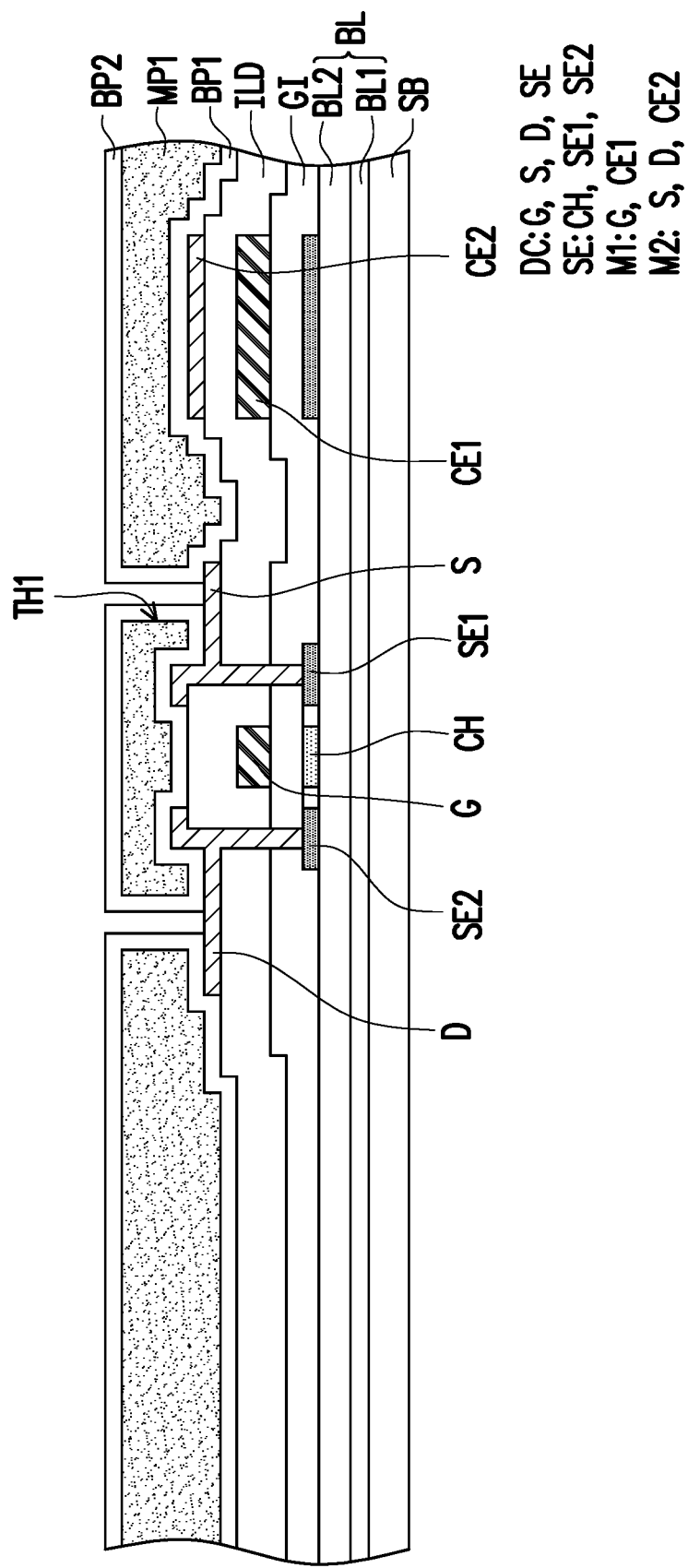

Referring to FIG. 1C, a second insulating layer BP2 is formed on the first heat dissipation layer MP1, wherein the second insulating layer BP2 covers the first heat dissipation layer MP1. In detail, the second insulating layer BP2 is formed in the plurality of through holes TH1 of the first heat dissipation layer MP1, and the structure formed by the first insulating layer BP1 covers the first heat dissipation layer MP1. The design of this structure may avoid defects of the first heat dissipation layer MP1 due to the influence of the subsequent film layer manufacturing process. In addition, before the second insulating layer BP2 is formed, the first insulating layer BP1 exposed via the plurality of through holes TH1 is first removed to expose a portion of the source S and the drain D. Accordingly, in the present embodiment, since the second insulating layer BP2 is formed only at the sidewall of the first heat dissipation layer MP1 in the plurality of through holes TH1, a portion of the source S and the drain D are exposed. In some embodiments, the second insulating layer BP2 is formed by using a physical vapor deposition method or a chemical vapor deposition method. In the present embodiment, the material of the second insulating layer BP2 includes an inorganic material, and may be silicon oxide, silicon nitride, silicon oxynitride, or stacked layers of at least two of the above materials, but the invention is not limited thereto. The second insulating layer BP2 may be a single-layer structure, but the invention is not limited thereto. In other embodiments, the second insulating layer BP2 may also be a multilayer structure.

Figure 1D:
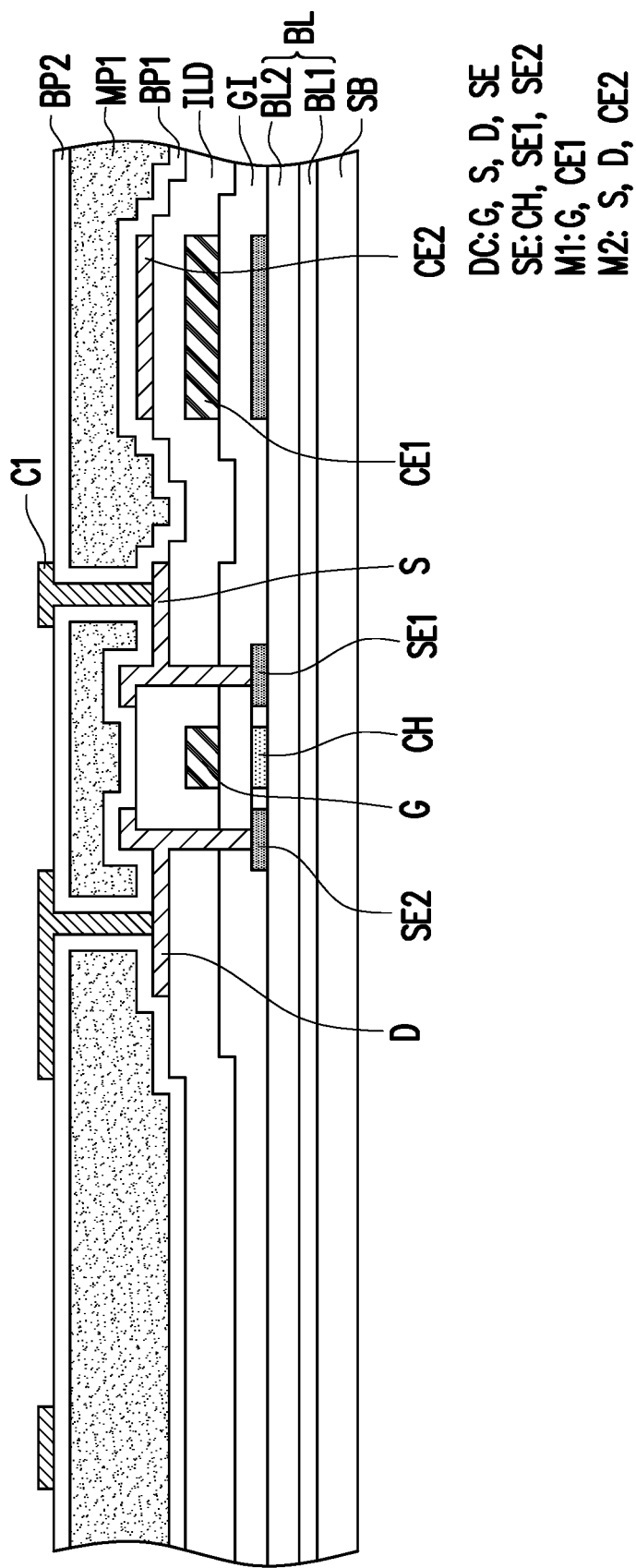

Referring to FIG. 1D, a signal line layer C1 is formed on the second insulating layer BP2, wherein the signal line layer C1 is filled at least in the through holes TH1 to be electrically connected to the source S and the drain D. Based on the consideration of conductivity, the signal line layer C1 is generally made of a metal material. However, the invention is not limited thereto, and the signal line layer C1 may also include other transparent conductive materials other than metal materials. The signal line layer C1 is formed by, for example, using a physical vapor deposition method or a metal chemical vapor deposition method and then performing a lithography process.

Figure 1E:
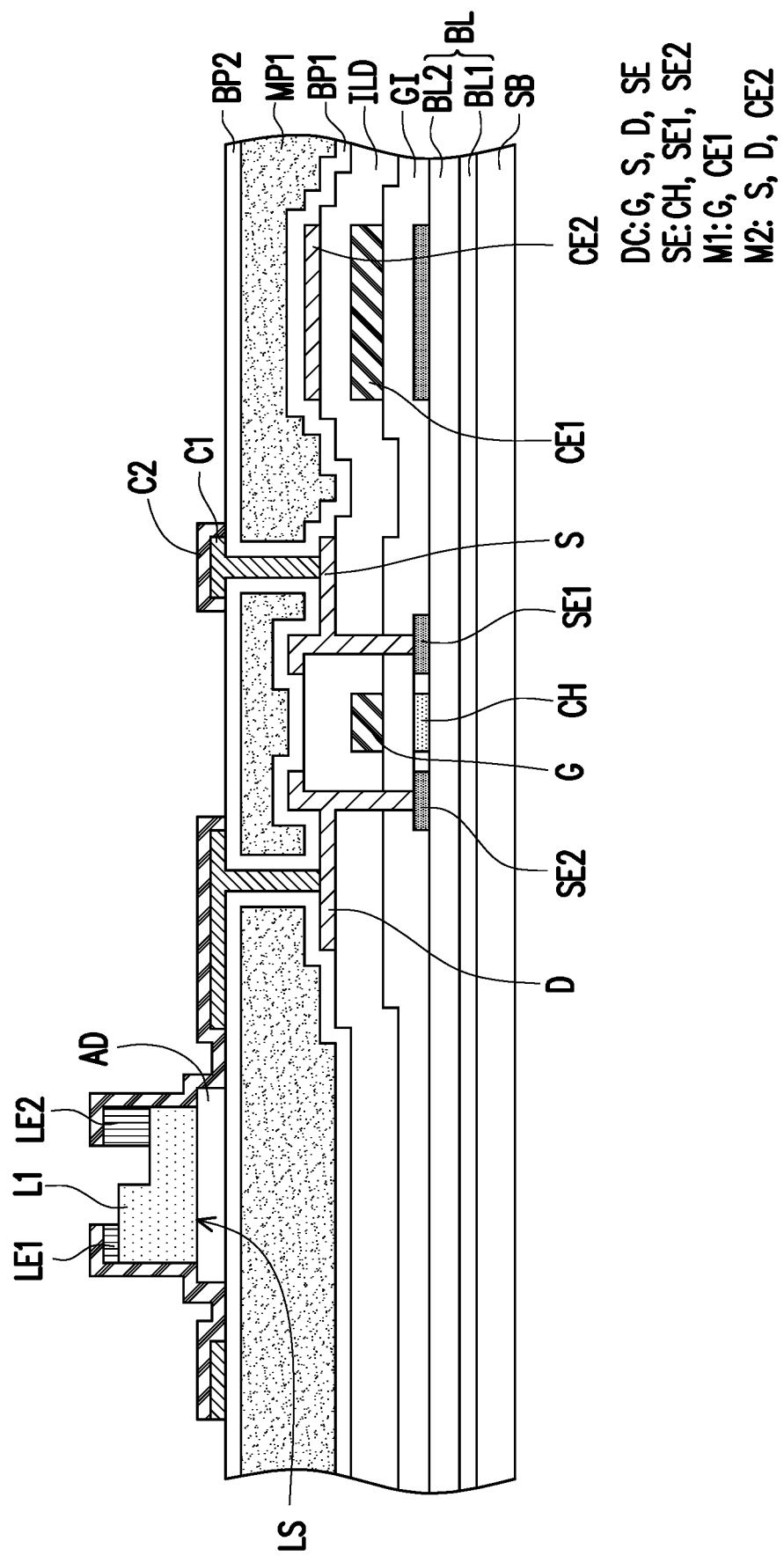

Referring to FIG. 1E, a light-emitting element L1 is formed on the second insulating layer BP2, wherein before the light-emitting element L1 is formed on the second insulating layer BP2, an adhesive layer AD may be disposed on the second insulating layer BP2 first, so that the light-emitting element L1 is adhered to the second insulating layer BP2 via the adhesive layer AD. In the present embodiment, the light-emitting element L1 is a lateral light-emitting diode. Specifically, the light-emitting element L1 of the present embodiment includes a first semiconductor layer (not shown), a light-emitting layer (not shown), and a second semiconductor layer (not shown) disposed in sequence, wherein a first electrode LE1 electrically connected to the first semiconductor layer and a second electrode LE2 electrically connected to the second semiconductor layer are also disposed, and the first electrode LE1 and the second electrode LE2 are disposed at the same side. In some embodiments, the conductivity type of the first semiconductor layer is different from the conductivity type of the second semiconductor layer. For example, the first semiconductor layer may be a P-type semiconductor material, and the second semiconductor layer may be an N-type semiconductor material. The P-type semiconductor material and the N-type semiconductor material may include gallium nitride (GaN), indium gallium nitride (InGaN), gallium arsenide (GaAs), or other materials composed of Group IIIA and Group VA elements, or other suitable materials, and the invention is not limited thereto. The light-emitting layer may, for example, have a quantum well, so that the holes provided by the P-type semiconductor layer and the electrons provided by the N-type semiconductor layer may be combined in the light-emitting layer to emit photons. In addition, the material of the light-emitting layer may include gallium nitride, indium gallium nitride, gallium arsenide, or other materials composed of Group IIIA and Group VA elements, or other suitable materials. In the present embodiment, the light-emitting element L1 is selected to include gallium nitride with a refractive index of about 2.3.

Please continue to refer to FIG. 1E, next, a power line layer C2 is formed on the second insulating layer BP2, wherein the power line layer C2 is located at least above and in contact with the first electrode LE1 and the second electrode LE2 and the signal line layer C1, and the first electrode LE1 and the second electrode LE2 of the light-emitting element L1 are electrically connected to the signal line layer C1 via the power line layer C2. Based on the consideration of conductivity, the power line layer C2 is generally made of a metal material. However, the invention is not limited thereto, and the power line layer C2 may also include other transparent conductive materials other than metal materials. The power line layer C2 is formed by, for example, using a physical vapor deposition method or a metal chemical vapor deposition method and then performing a lithography process.

Figure 1F:
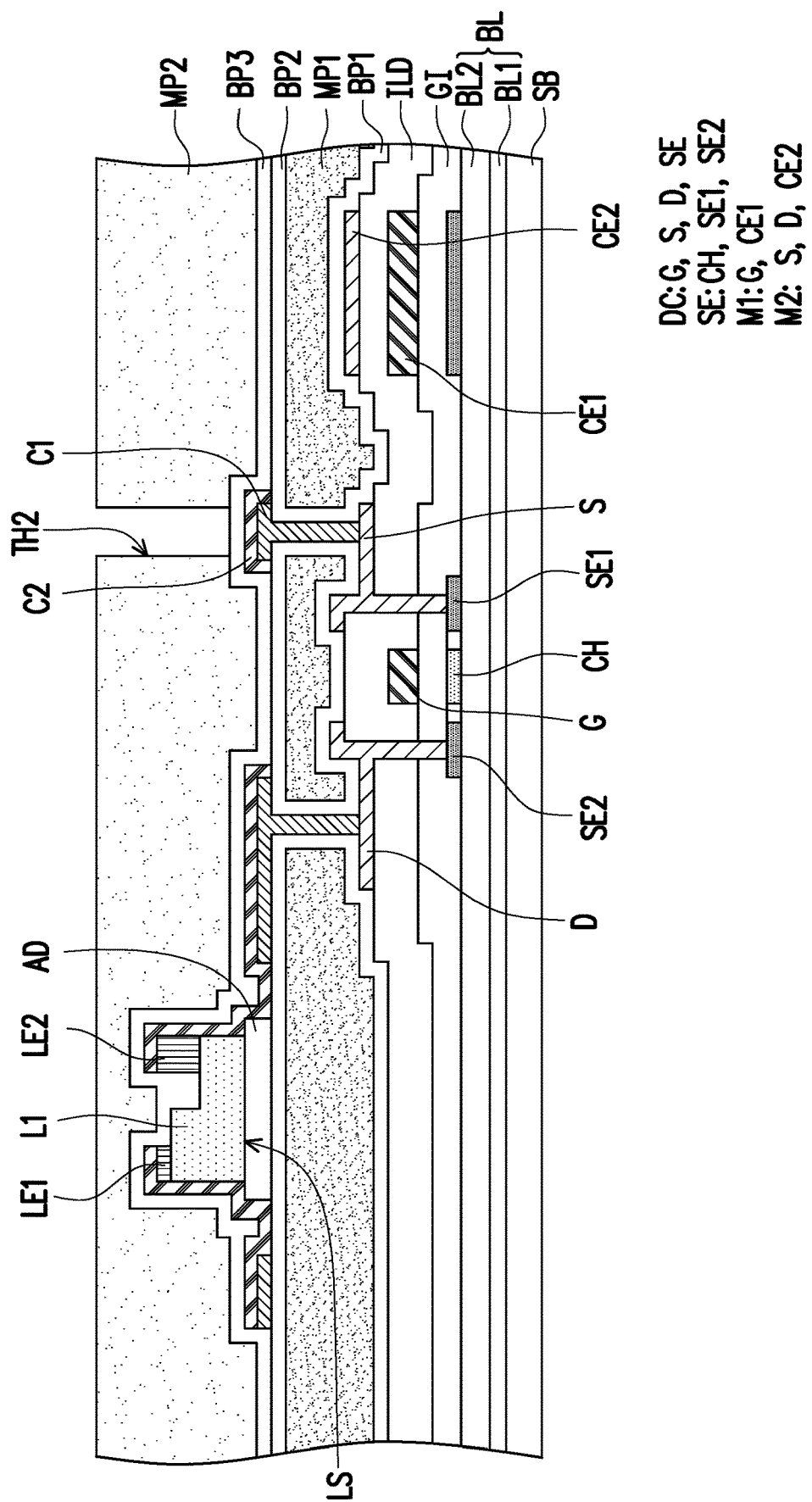

Referring to FIG. 1F, a third insulating layer BP3 is formed on the light-emitting element L1, wherein the third insulating layer BP3 covers the light-emitting element L1. In some embodiments, the third insulating layer BP3 is formed by using a physical vapor deposition method or a chemical vapor deposition method. In the present embodiment, the material of the third insulating layer BP3 includes an inorganic material, and may be silicon oxide, silicon nitride, silicon oxynitride, or stacked layers of at least two of the above materials, but the invention is not limited thereto. The third insulating layer BP3 may be a single-layer structure, but the invention is not limited thereto. In other embodiments, the third insulating layer BP3 may also be a multi-layer structure.

Referring further to FIG. 1F, a second heat dissipation layer MP2 is formed on the third insulating layer BP3, wherein the second heat dissipation layer MP2 covers the light-emitting element L1 and includes a plurality of through holes TH2 exposing a portion of the third insulating layer BP3. The second heat dissipation layer MP2 also has the characteristics of high thermal conductivity. In the present embodiment, the material of the second heat dissipation layer MP2 is also an oxide including a plurality of microparticles, and includes $Al_2O_3$, $TiO_2$, or a combination thereof. In some embodiments, the coefficient of thermal conductivity of the second heat dissipation layer MP2 is at least greater than 1 W/(m·K). In a preferred embodiment, the coefficient of thermal conductivity of the second heat dissipation layer MP2 is 4.8 W/(m·K) to 70 W/(m·K). In the present embodiment, the second heat dissipation layer MP2 is opposite to the light-emitting surface LS of the light-emitting element L1 (the refractive index of the material included is about 2.3). Accordingly, the refractive index of the second heat dissipation layer MP2 is preferably 1.5 to 1.8 to have a high reflectivity effect. It should be mentioned that, the material of the second heat dissipation layer MP2 is not limited to $Al_2O_3$ or $TiO_2$. Other materials with a coefficient of thermal conductivity and refractive index meeting the above ranges may also be selected as the material of the second heat dissipation layer MP2. Moreover, in the present embodiment, the refractive index of the second heat dissipation layer MP2 is less than the refractive index of the first heat dissipation layer MP1, because the density of the microparticles included in the second heat dissipation layer MP2 is less than the density of the microparticles included in the first heat dissipation layer MP1. In this case, the coefficient of thermal conductivity of the second heat dissipation layer MP2 is also less than the coefficient of thermal conductivity of the first heat dissipation layer MP1.

Figure 1G:
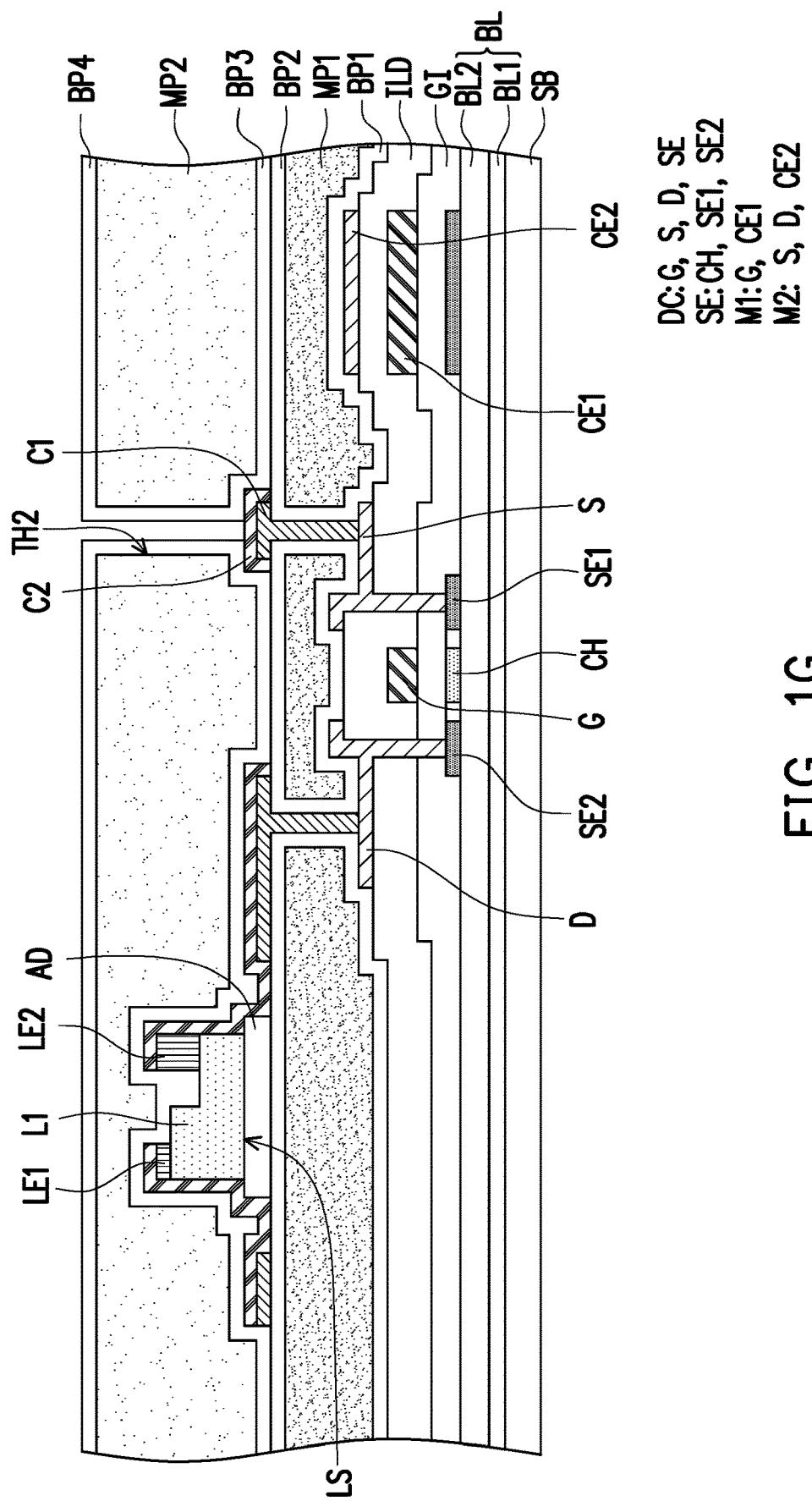

Referring to FIG. 1G, a fourth insulating layer BP4 is formed on the second heat dissipation layer MP2, wherein the fourth insulating layer BP4 covers the second heat dissipation layer MP2. In detail, the fourth insulating layer BP4 is formed in the plurality of through holes TH2 of the second heat dissipation layer MP2, and the structure formed by the third insulating layer BP3 covers the second heat dissipation layer MP2. The design of this structure may avoid defects of the second heat dissipation layer MP2 due to the influence of the subsequent film layer manufacturing process. In addition, before the fourth insulating layer BP4 is formed, the third insulating layer BP3 exposed via the plurality of through holes TH2 is first removed to expose a portion of the power line layer C2 electrically connected to the source S. Accordingly, in the present embodiment, since the fourth insulating layer BP4 is formed only at the sidewall of the second heat dissipation layer MP2 in the plurality of through holes TH2, a portion of the power line layer C2 electrically connected to the source S is exposed. In some embodiments, the fourth insulating layer BP4 is formed by using a physical vapor deposition method or a chemical vapor deposition method. In the present embodiment, the material of the fourth insulating layer BP4 includes an inorganic material, and may be silicon oxide, silicon nitride, silicon oxynitride, or stacked layers of at least two of the above materials, but the invention is not limited thereto. The fourth insulating layer BP4 may be a single-layer structure, but the invention is not limited thereto. In other embodiments, the fourth insulating layer BP4 may also be a multilayer structure.

Figure 1H:
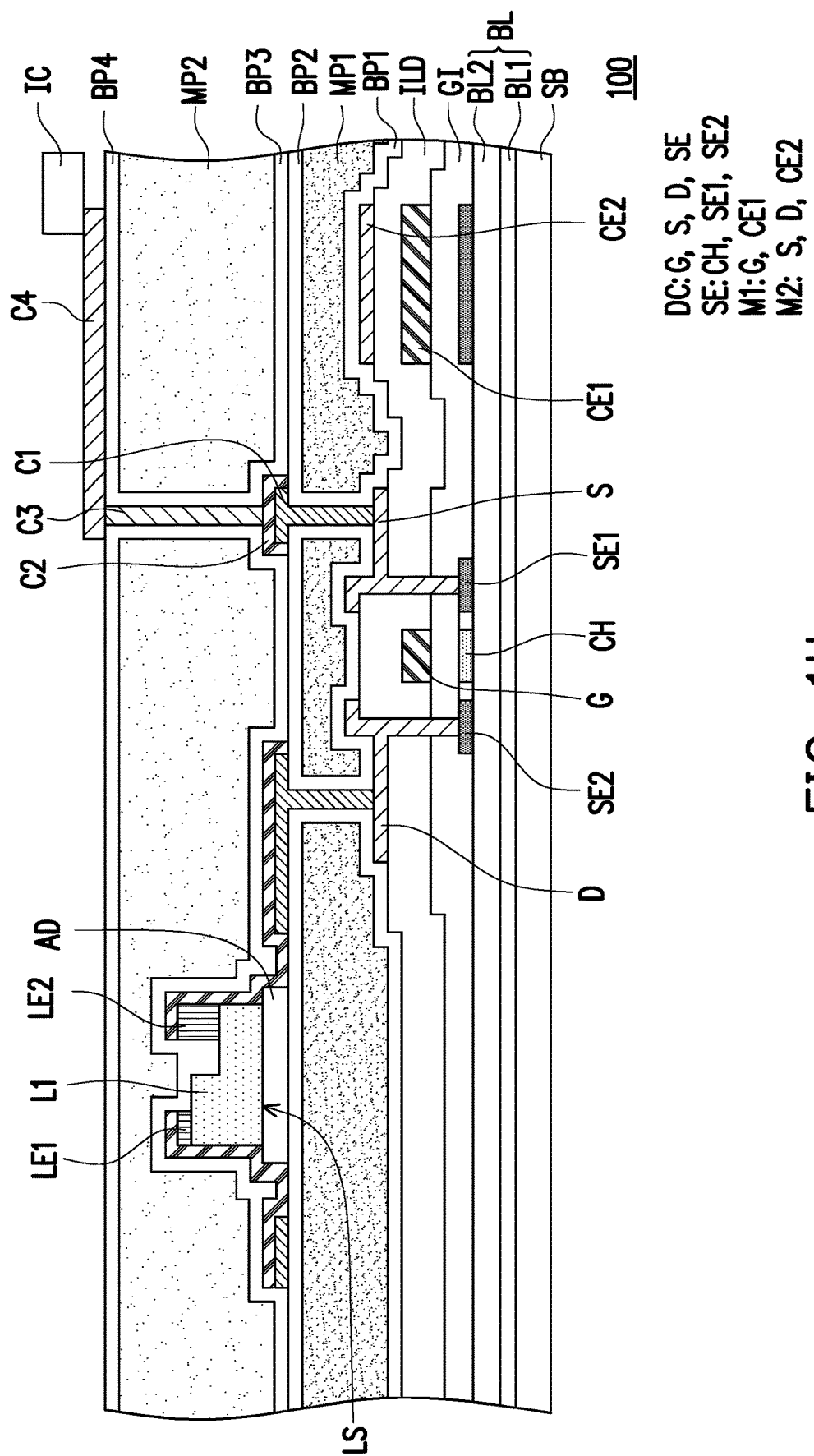

Referring to FIG. 1H, a conductive structure C3 is formed in the plurality of through holes TH2, wherein the conductive structure C3 is filled in the plurality of through holes TH2. Based on the consideration of conductivity, the conductive structure C3 is generally made of a metal material. However, the invention is not limited thereto, and the conductive structure C3 may also include other transparent conductive materials other than metal materials.

Referring further to FIG. 1H, a drive circuit layer C4 and a driver chip IC are formed on the fourth insulating layer BP4, wherein the drive circuit layer C4 is electrically connected to the conductive structure C3, so that the driver chip IC is electrically connected to the drive element DC via the drive circuit layer C4, thereby providing a drive signal to the drive element DC. Based on the consideration of conductivity, the drive circuit layer C2 is generally made of a metal material. However, the invention is not limited thereto, and the drive circuit layer C2 may also include other transparent conductive materials other than metal materials.

Based on the above, in the present embodiment, the first heat dissipation layer and the second heat dissipation layer are respectively disposed below and above the light-emitting element, so that the heat generated by the light-emitting element may be quickly dissipated when the light-emitting element is in operation to achieve a lower operating temperature. Therefore, the light-emitting efficiency of the light-emitting element of the present embodiment may be improved accordingly. Moreover, in the present embodiment, the first heat dissipation layer facing the light-emitting surface of the light-emitting element and the second heat dissipation layer opposite to the light-emitting surface of the light-emitting element each have the above refractive index, thereby increasing the light output intensity of the light-emitting element.

At this point, the manufacture of the display panel 100 of the invention is completed.

Although the manufacturing method of the display panel 100 of the present embodiment is described by taking the above method as an example, the method of forming the display panel 100 of the invention is not limited thereto.

Please continue to refer to FIG. 1H. FIG. 1H shows a partial schematic diagram of the display panel 100 of an embodiment of the invention. The display panel 100 of an embodiment of the invention includes the drive element DC, the first heat dissipation layer MP1, the light-emitting element L1, and the second heat dissipation layer MP2.

The drive element DC is disposed on the substrate SB, for example. In some embodiments, the buffer layer BL may be disposed between the drive element DC and the substrate SB, and the invention is not limited thereto. The components of the drive element DC and the relative arrangement relationship between these components are as provided in the above embodiments, and are not repeated herein.

The first heat dissipation layer MP1 is disposed on the drive element DC, for example. In the present embodiment, the material of the first heat dissipation layer MP1 includes a plurality of microparticles including $Al_2O_3$, $TiO_2$, or a combination thereof. Moreover, in the present embodiment, the first heat dissipation layer MP1 faces the light-emitting surface LS of the light-emitting element L1 (the refractive index of the material included is about 2.3). Accordingly, the refractive index of the first heat dissipation layer MP1 is designed between 1.8 and 2.3, so as to achieve refractive index matching with the light-emitting element L1 and have the effect of high transmittance. In some embodiments, the coefficient of thermal conductivity of the first heat dissipation layer MP1 is at least greater than 1 W/(m·K). In a preferred embodiment, the coefficient of thermal conductivity of the first heat dissipation layer MP1 is 4.8 W/(m·K) to 70 W/(m·K). The first heat dissipation layer MP1 of the present embodiment is, for example, covered by a structure formed by the first insulating layer BP1 and the second insulating layer BP2, so as to avoid defects of the first heat dissipation layer MP1 due to the placement of the remaining film layers thereof.

The light-emitting element L1 is disposed on the first heat dissipation layer MP1, for example. In the present embodiment, the light-emitting element L1 is a horizontal light-emitting diode, but it should be noted that the invention is not limited thereto. In other embodiments, the light-emitting element may be a flip-chip light-emitting diode. In addition, in the present embodiment, the refractive index of the material included in the light-emitting element L1 is about 2.3.

The second heat dissipation layer MP2 is disposed on the light-emitting element L1, for example. In the present embodiment, the material of the second heat dissipation layer MP2 includes a plurality of microparticles including $Al_2O_3$, $TiO_2$, or a combination thereof. Moreover, in the present embodiment, the second heat dissipation layer MP2 is opposite to the light-emitting surface LS of the light-emitting element L1 (the refractive index of the material included is about 2.3). Accordingly, the refractive index of the second heat dissipation layer MP2 is designed between 1.5 and 1.8 to achieve a high reflectivity effect. In some embodiments, the coefficient of thermal conductivity of the second heat dissipation layer MP2 is at least greater than 1 W/(m·K). In a preferred embodiment, the coefficient of thermal conductivity of the second heat dissipation layer MP2 is 4.8 W/(m·K) to 70 W/(m·K). Moreover, in the present embodiment, the refractive index of the second heat dissipation layer MP2 is less than the refractive index of the first heat dissipation layer MP1, because the density of the microparticles included in the second heat dissipation layer MP2 is less than the density of the microparticles included in the first heat dissipation layer MP1. In this case, the coefficient of thermal conductivity of the second heat dissipation layer MP2 is also less than the coefficient of thermal conductivity of the first heat dissipation layer MP1. The second heat dissipation layer MP2 of the present embodiment is, for example, covered by a structure formed by the third insulating layer BP3 and the fourth insulating layer BP4, so as to avoid defects of the second heat dissipation layer MP2 due to the placement of the remaining film layers thereof.

In some embodiments, the display panel 100 further includes the first insulating layer BP1, the second insulating layer BP2, the third insulating layer BP3, the fourth insulating layer BP4, and the driver chip IC. The first insulating layer BP1 is disposed on the substrate SB and partially covers the drive element DC, for example. The second insulating layer BP2 is disposed on the first heat dissipation layer MP1, wherein the first heat dissipation layer MP1 is covered by a structure formed by the first insulating layer BP1 and the second insulating layer BP2. The third insulating layer BP3 is disposed on the second insulating layer BP2, for example. The fourth insulating layer BP4 is, for example, disposed on the third insulating layer BP3 and covers the second heat dissipation layer MP2, wherein the second heat dissipation layer MP2 is covered by a structure formed by the third insulating layer BP3 and the fourth insulating layer BP4. The driver chip IC is, for example, disposed on the fourth insulating layer BP4 and electrically connected to the drive element DC. The materials included in the first insulating layer BP1, the second insulating layer BP2, the third insulating layer BP3, the fourth insulating layer BP4, and the driver chip IC and the relative arrangement relationship with other components are as provided in the above embodiments, and are not repeated herein.

Based on the above, in the present embodiment, by locating the light-emitting element between the first heat dissipation layer and the second heat dissipation layer, the heat generated thereby may be quickly dissipated during operation, so that the light-emitting element has a lower operating temperature. Therefore, the light-emitting efficiency of the light-emitting element of the present embodiment may be improved accordingly. Moreover, in the present embodiment, the first heat dissipation layer facing the light-emitting surface of the light-emitting element and the second heat dissipation layer opposite to the light-emitting surface of the light-emitting element have the refractive index above, respectively. In this way, the light output intensity of the light-emitting element may be increased, so as to improve the display effect of the display panel of the present embodiment.

FIG. 2A to FIG. 2H are schematic cross-sectional views of a manufacturing method of a display panel of the second embodiment of the invention. It should be mentioned here that, the embodiments of FIG. 2A to FIG. 2H each adopt the reference numerals of the embodiment of FIG. 1A to FIG. 1H and a portion of the contents thereof, wherein the same or similar numerals are used to represent the same or similar elements and descriptions of the same technical contents are omitted. For the description of the omitted parts, please refer to the descriptions and effects of the above embodiments, which are not repeated in the following embodiments, and for at least part of the descriptions not omitted in the embodiments shown in FIG. 2A to FIG. 2H, please refer to the subsequent content.

Figure 2A:
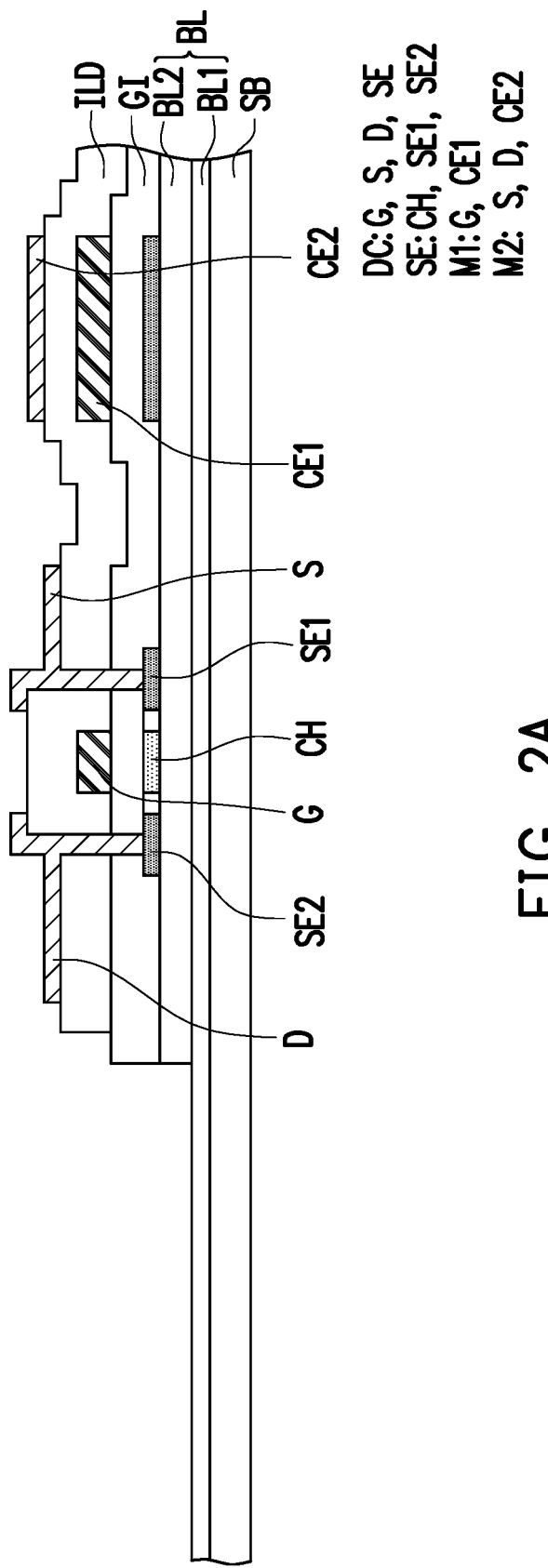
FIG. 2A to FIG. 2H are schematic cross-sectional views of a manufacturing method of a display panel of the second embodiment of the invention.
Figure 2B:
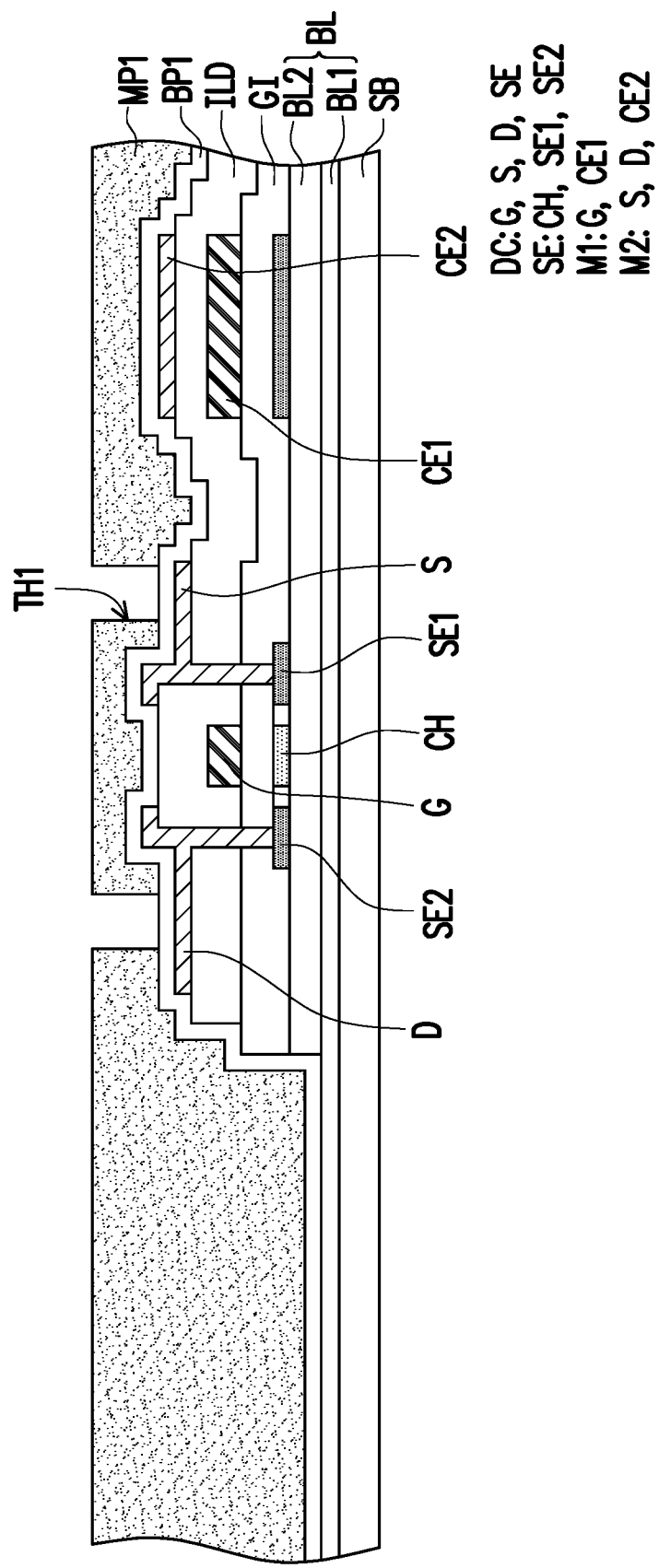
Figure 2C:
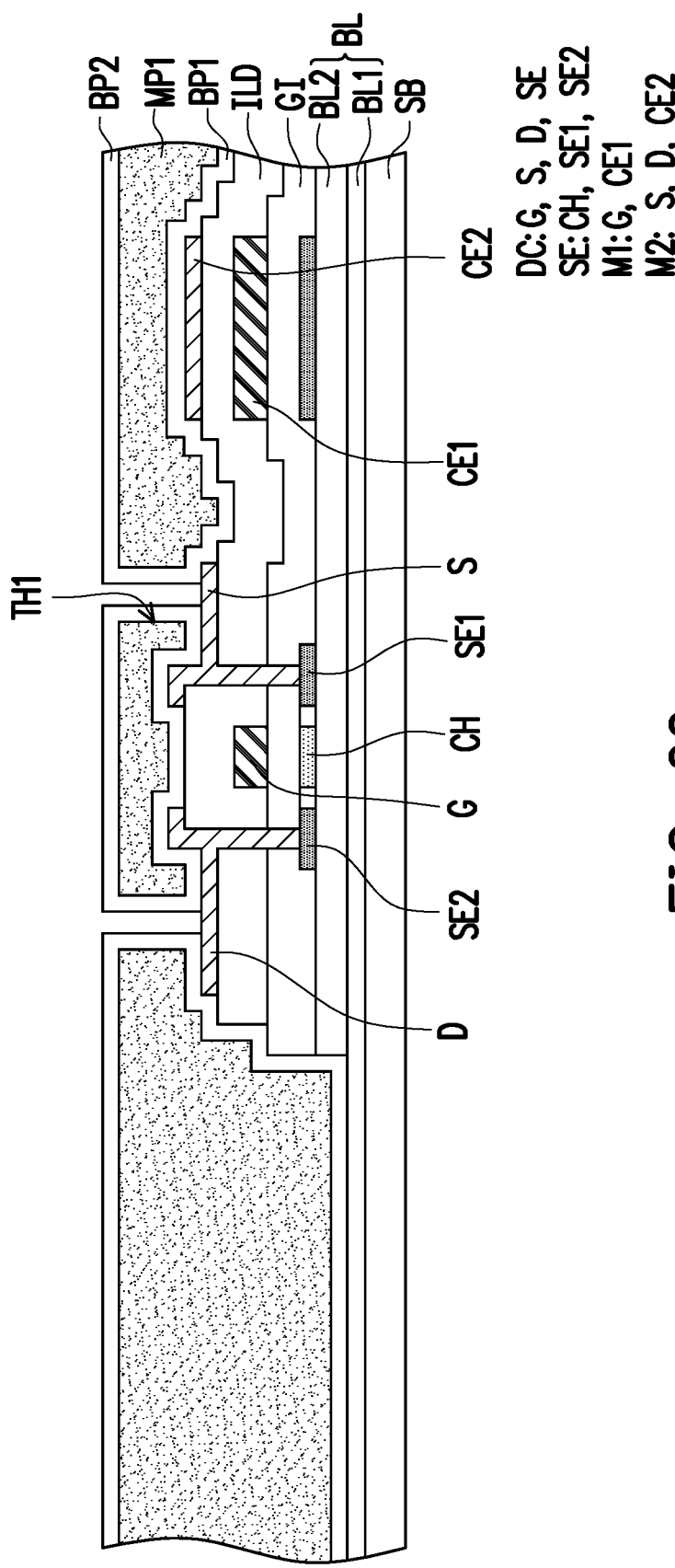
Figure 2D:
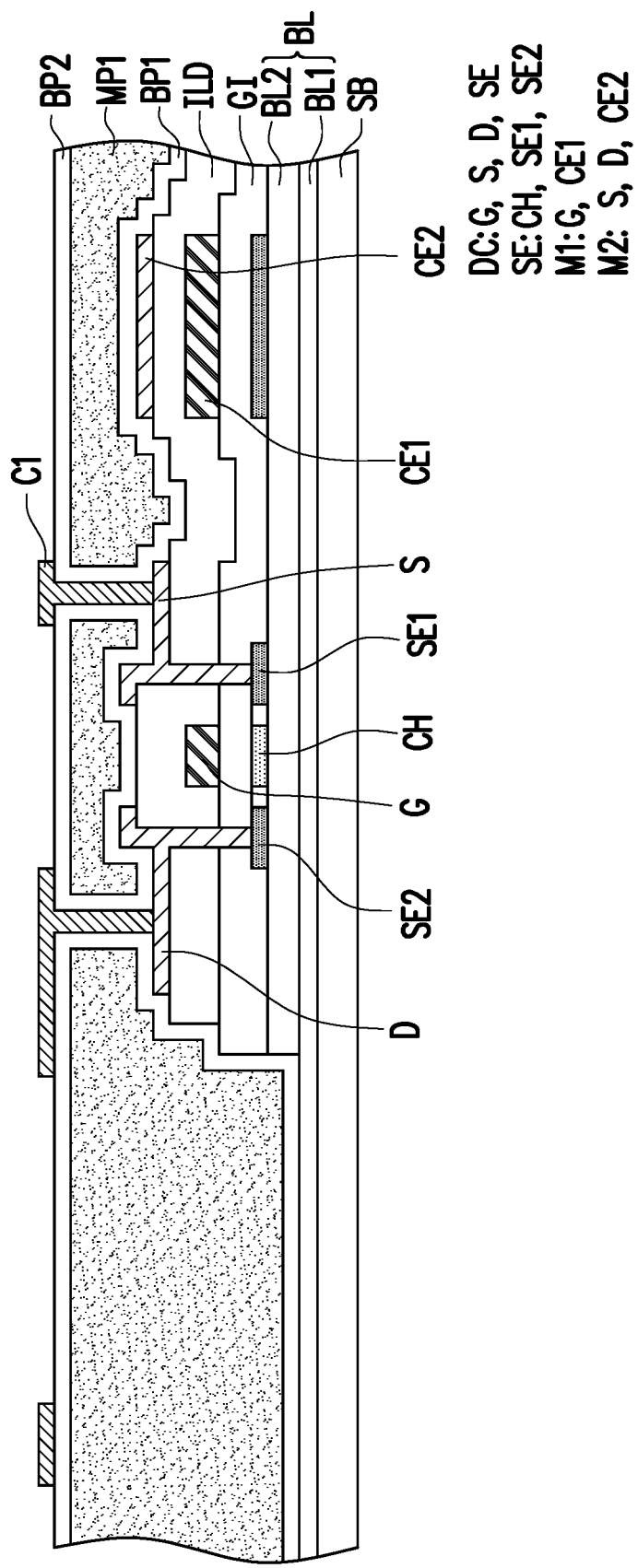
Figure 2E:
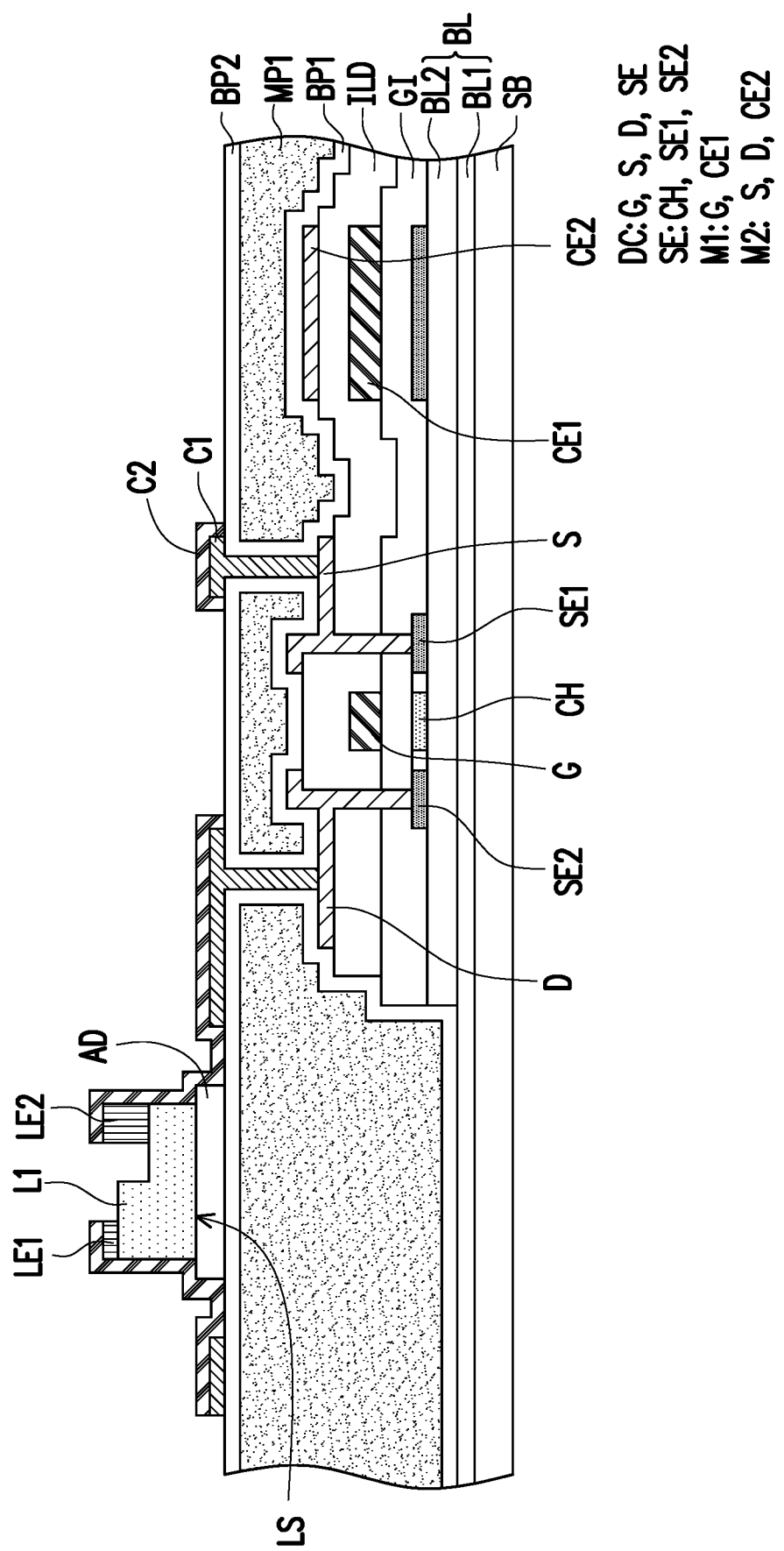
Figure 2F:
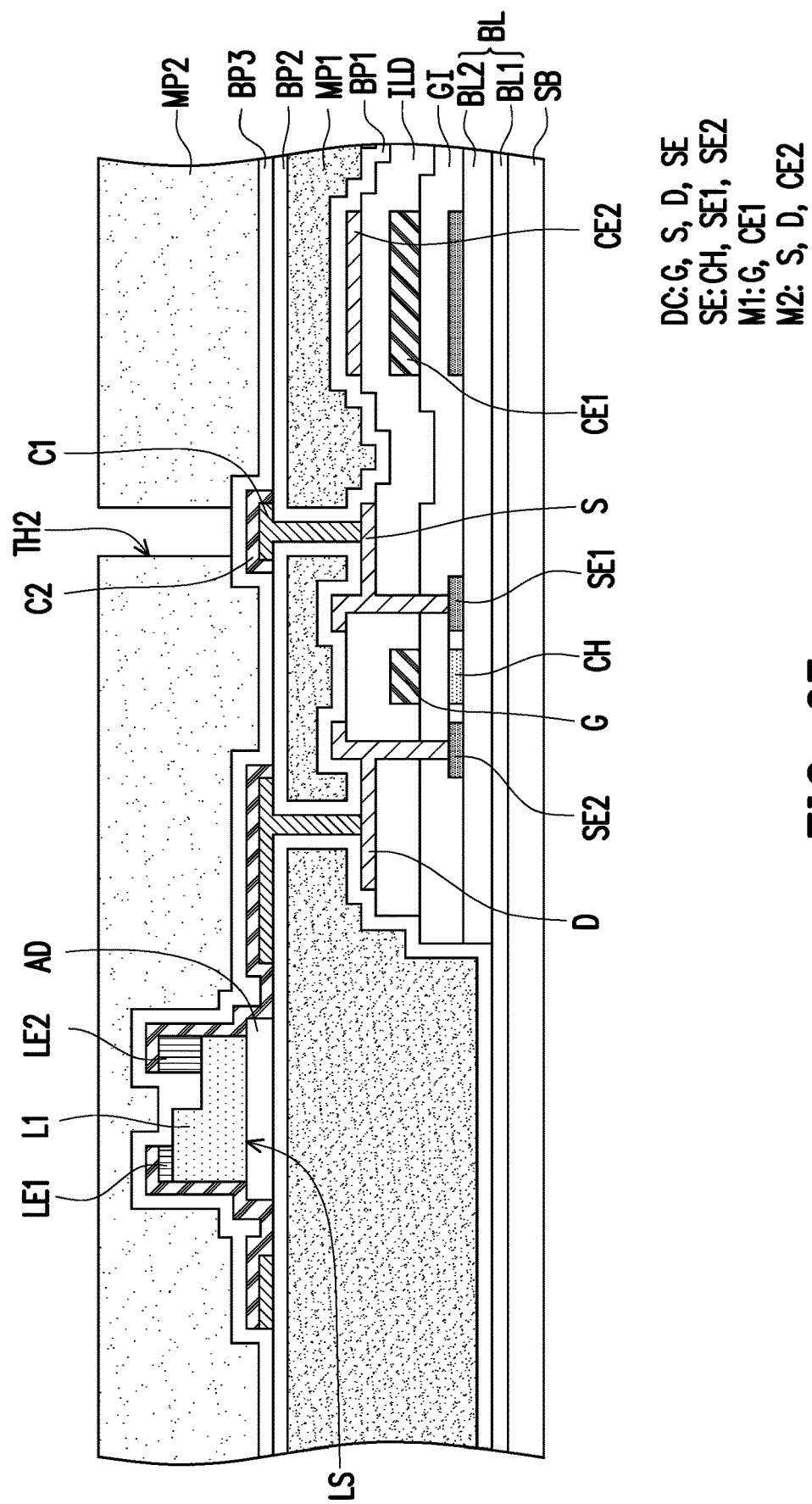
Figure 2G:
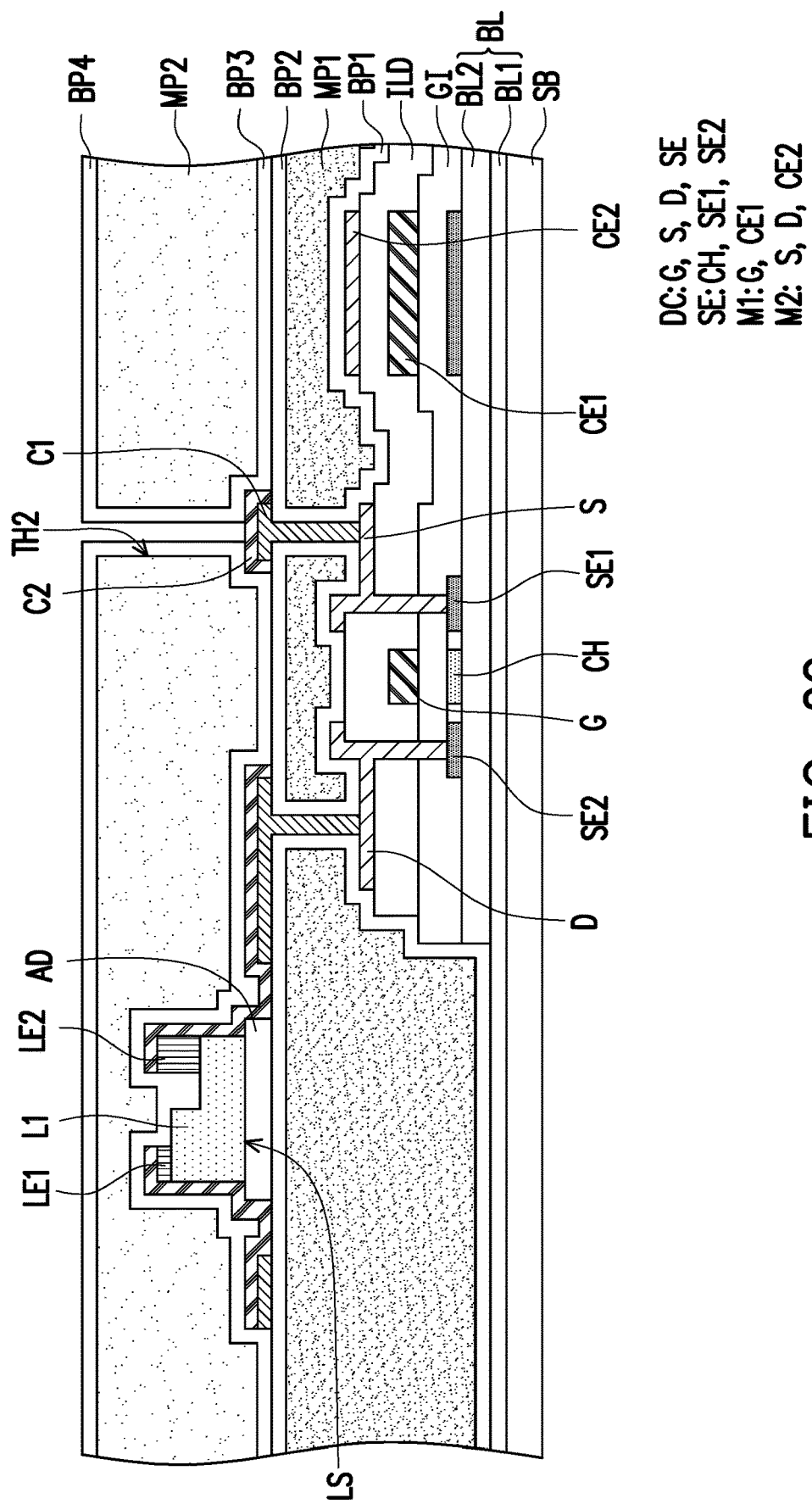
Figure 2H:
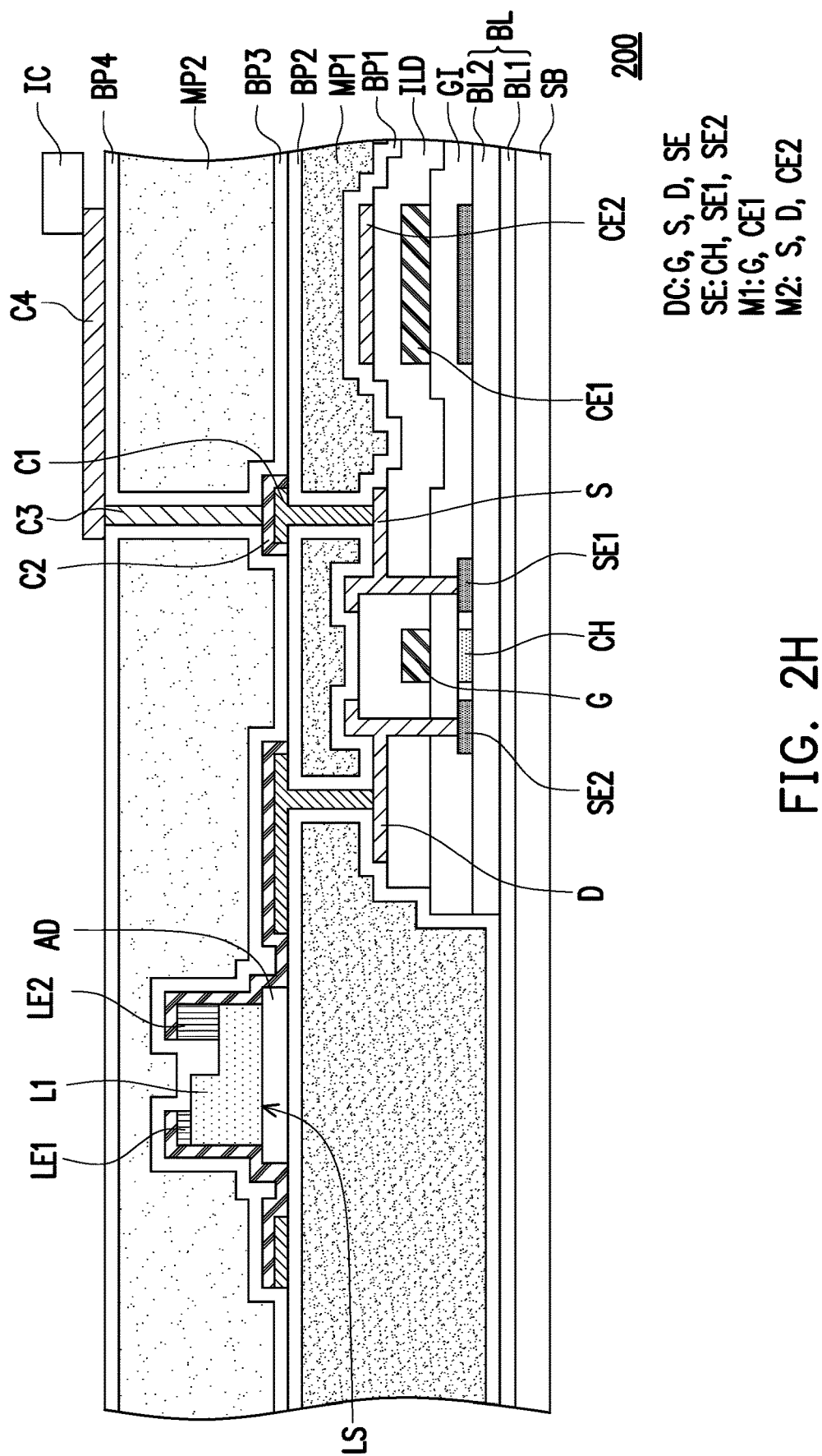

Referring to FIG. 2A to FIG. 2H at the same time, the main difference between the manufacturing method of a display panel 200 of the present embodiment and the manufacturing method of the display panel 100 of the above embodiment is: in the process shown in FIG. 2A, the buffer layer BL, the gate dielectric layer GI, and the interlayer dielectric ILD are further partially removed. Therefore, the light-emitting surface LS of the light-emitting element L1 formed in the subsequent process shown in FIG. 2E at least is not overlapped with the first buffer layer BL1, the gate dielectric layer GI, and the interlayer dielectric ILD in the buffer layer BL. Since the material of the first buffer layer BL1, the gate dielectric layer GI, and the interlayer dielectric ILD is silicon oxide with a refractive index of about 1.5, in the present embodiment, the above manufacturing process and configuration may further achieve refractive index matching and the effect of higher transmittance, thereby further improving the display effect of the display panel 200.

Figure 3:
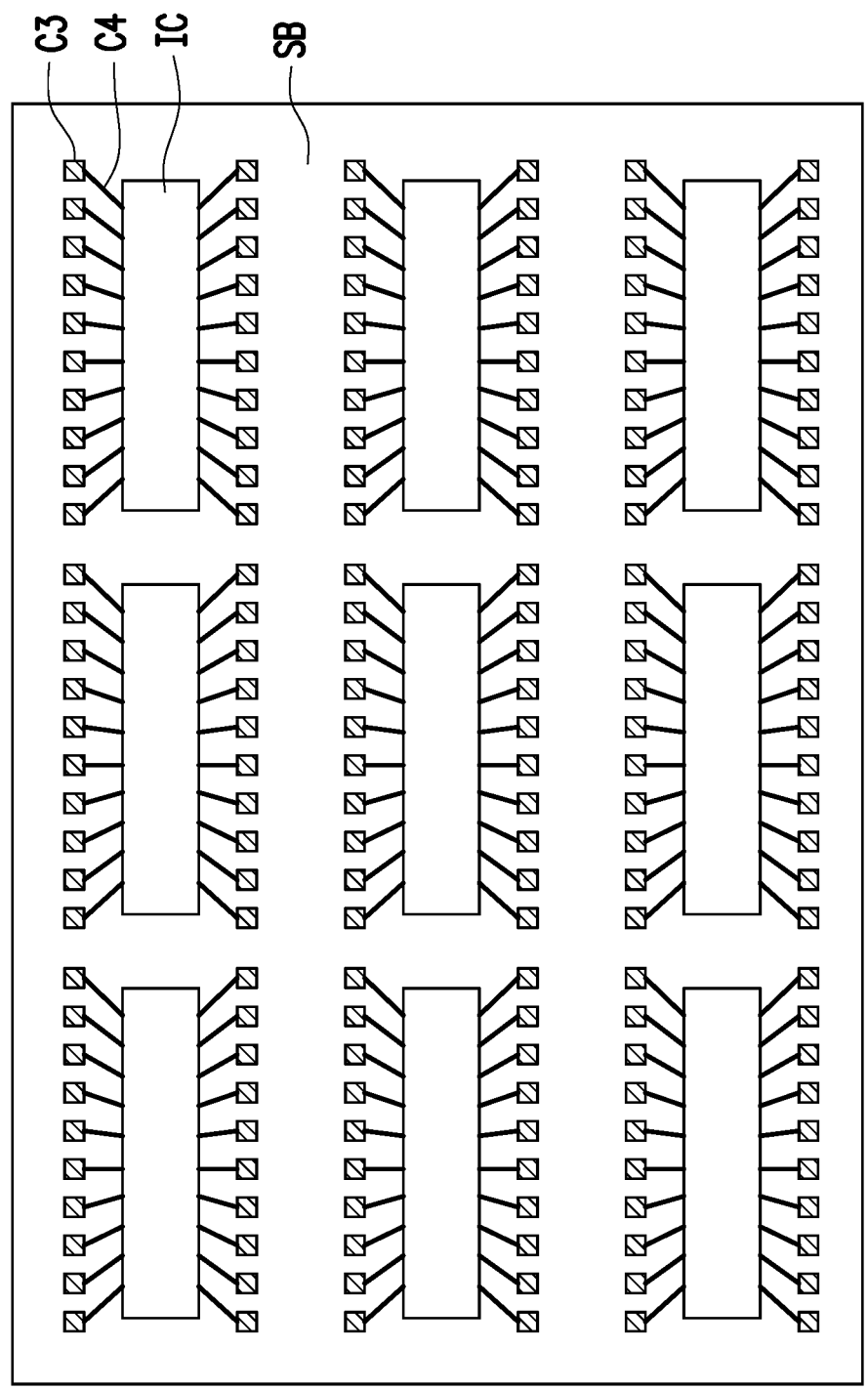
FIG. 3 is a schematic top view of the back surface of a display panel of the first embodiment and the second embodiment of the invention.

FIG. 3 is a schematic top view of the back surface of a display panel of the first embodiment and the second embodiment of the invention.

FIG. 3 shows the back surface of the substrate SB, the conductive structure C3, the drive circuit layer C4, and the driver chip IC, wherein the back surface of the substrate SB shown in FIG. 3 may be applied to the display panels 100 and 200 shown in FIG. 1 and FIG. 2 respectively. The conductive structure C3 may be arranged along at least one side of the driver chip IC, for example, and the invention is not limited thereto. The drive circuit layer C4 is, for example, wired on the back surface of the substrate SB, so that the driver chip IC is electrically connected to the conductive structure C3, so as to provide a drive signal to the drive element DC. Accordingly, in the present embodiment, by using the area on the back surface of the substrate SB for wiring, the size of the display panels 100 and 200 may be further reduced.

FIG. 4A to FIG. 4G are schematic cross-sectional views of a manufacturing method of a display panel of the third embodiment of the invention. It should be mentioned here that, the embodiments of FIG. 4A to FIG. 4G each adopt the reference numerals of the embodiment of FIG. 1A to FIG. 1G and a portion of the contents thereof, wherein the same or similar numerals are used to represent the same or similar elements and descriptions of the same technical contents are omitted. For the description of the omitted parts, please refer to the descriptions and effects of the above embodiments, which are not repeated in the following embodiments, and for at least part of the descriptions not omitted in the embodiments shown in FIG. 4A to FIG. 4G, please refer to the subsequent content.

Figure 4A:
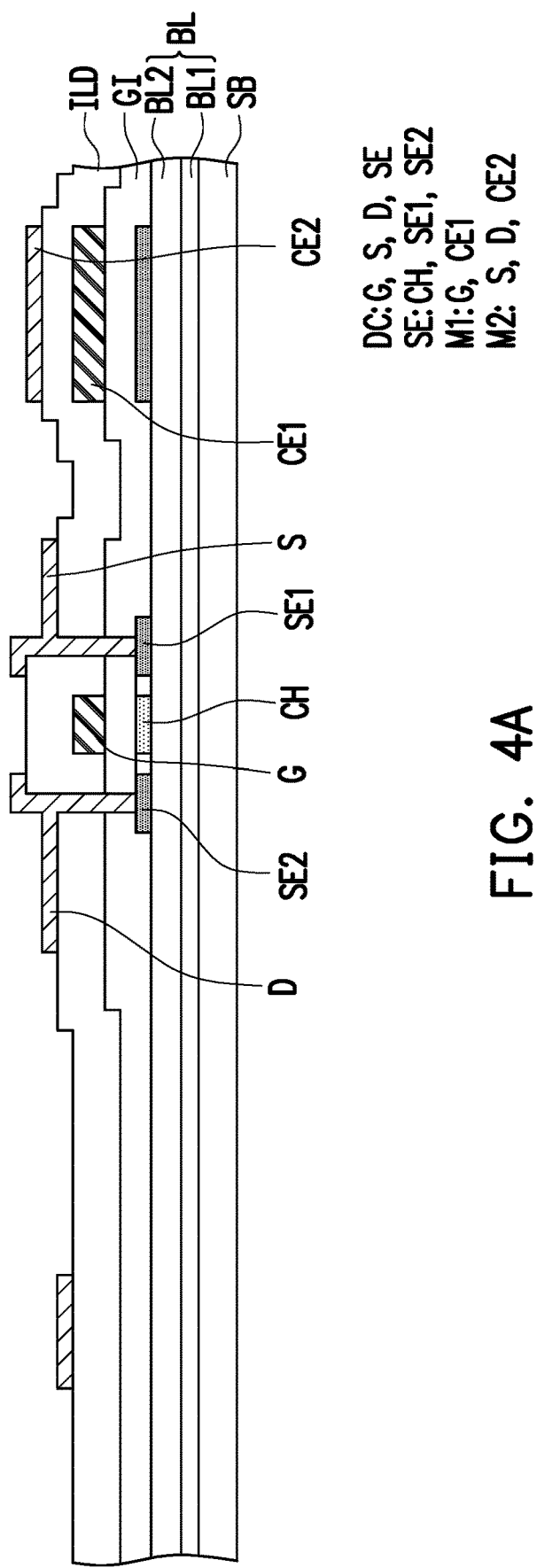
FIG. 4A to FIG. 4G are schematic cross-sectional views of a manufacturing method of a display panel of the third embodiment of the invention.
Figure 4B:
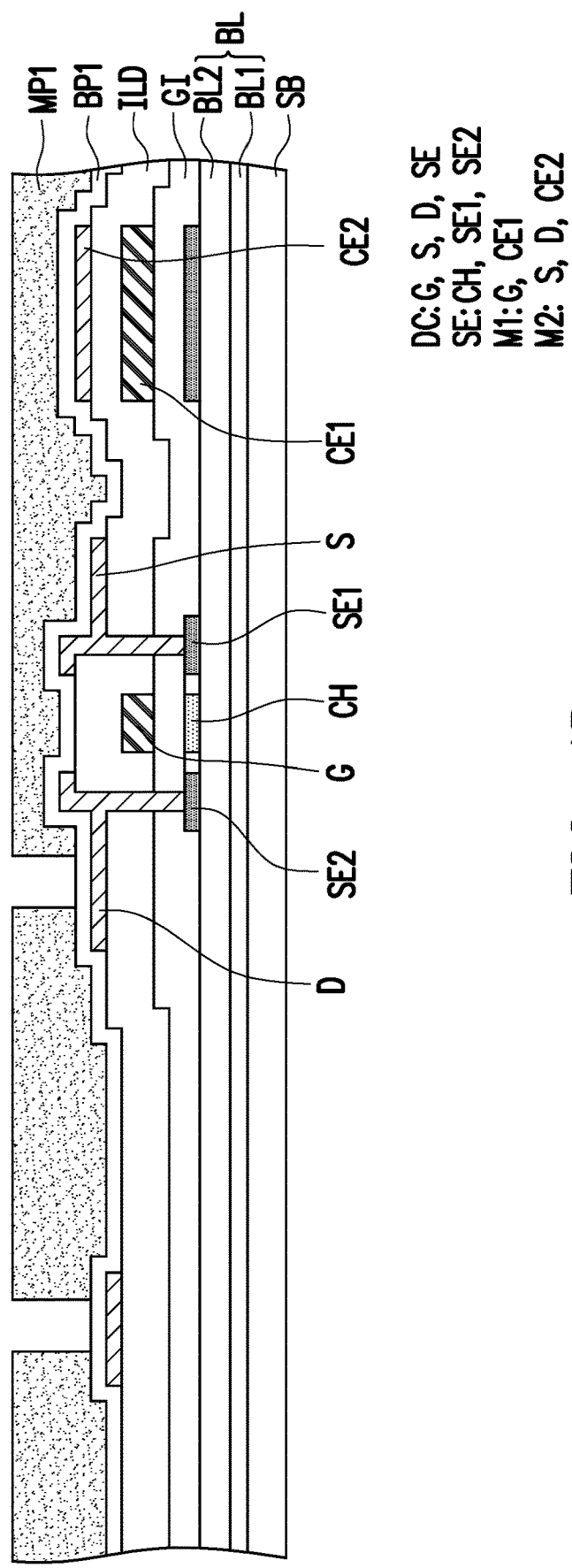
Figure 4C:
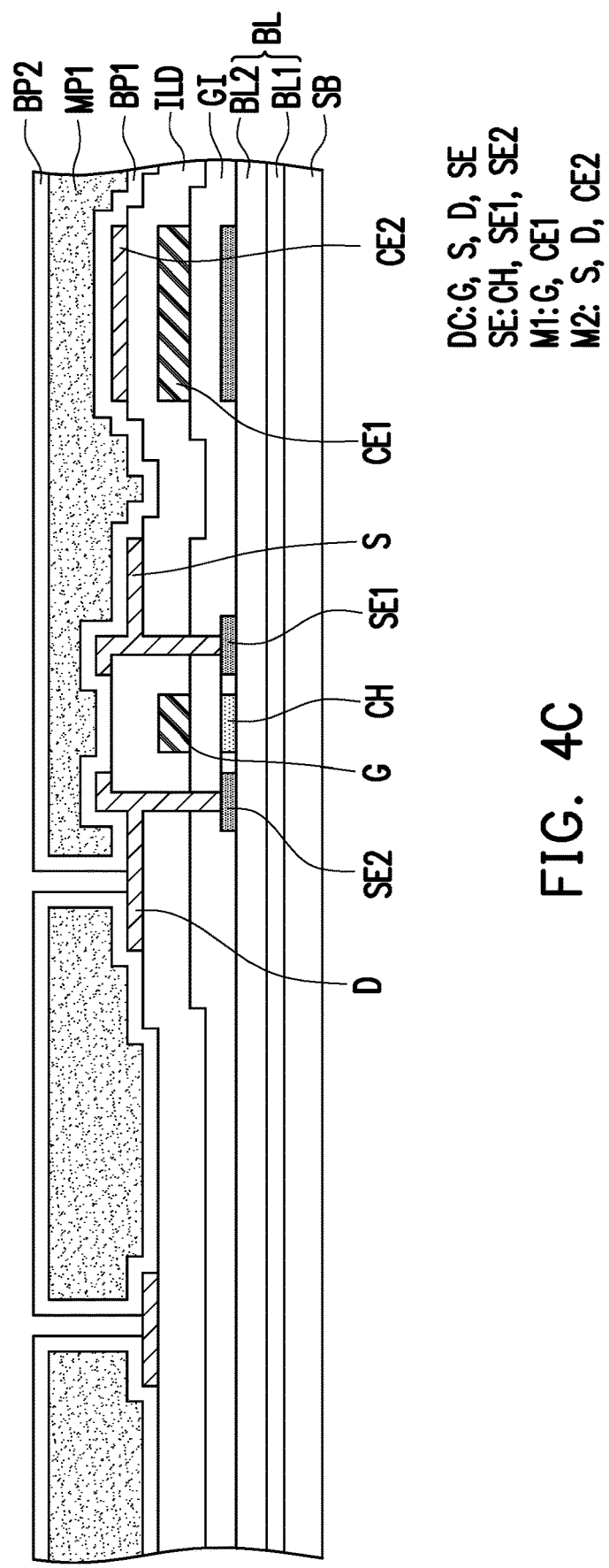
Figure 4D:
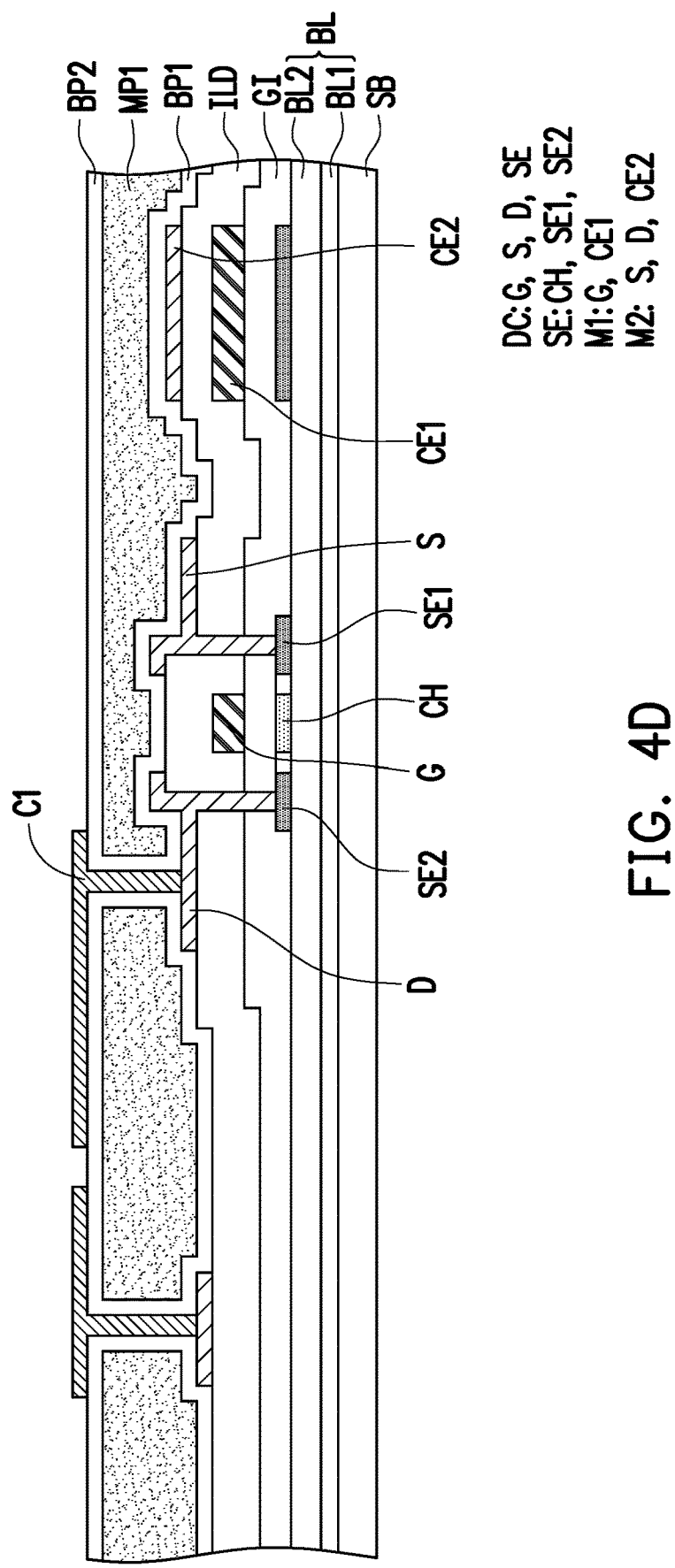
Figure 4E:
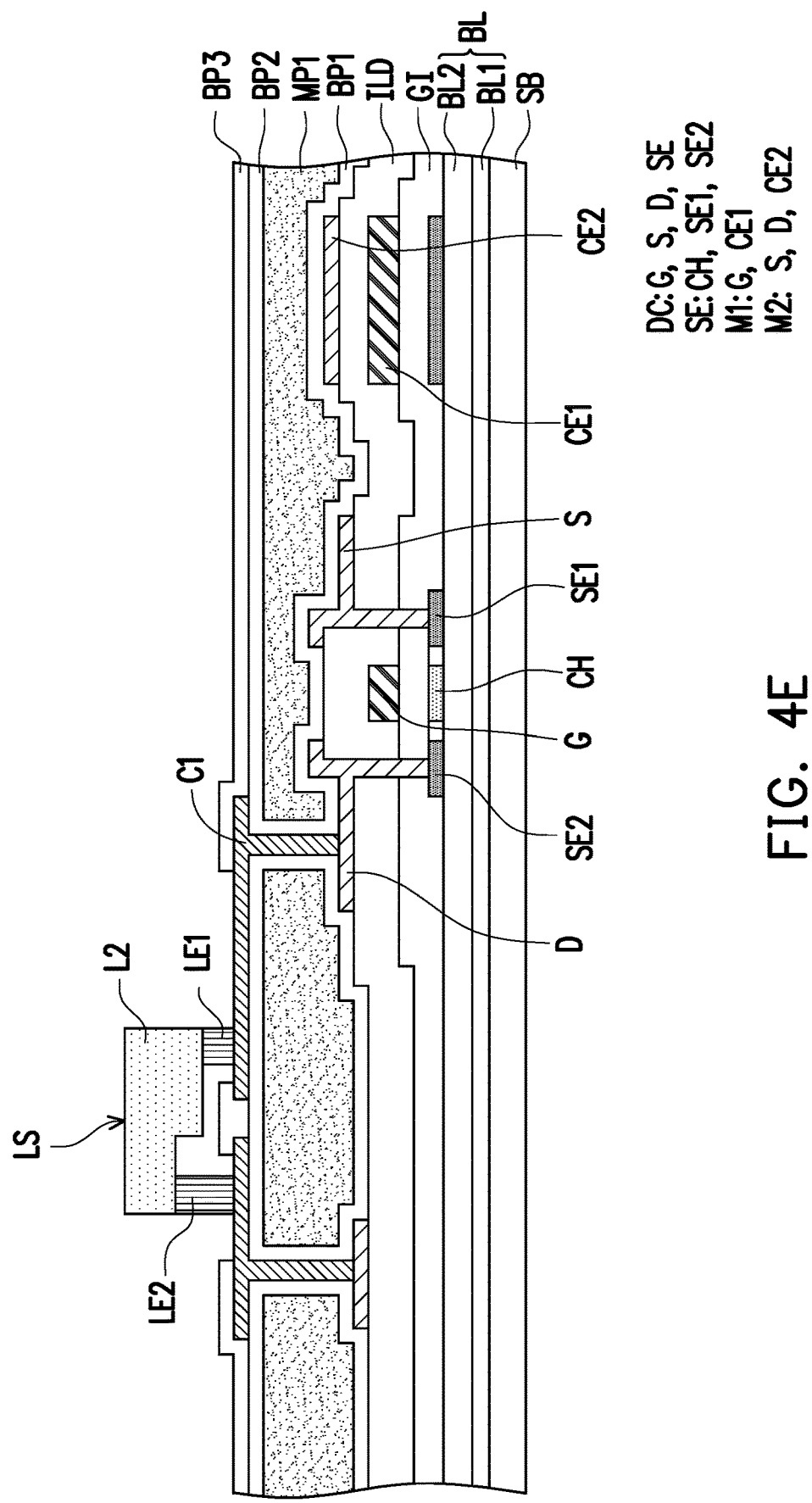
Figure 4F:
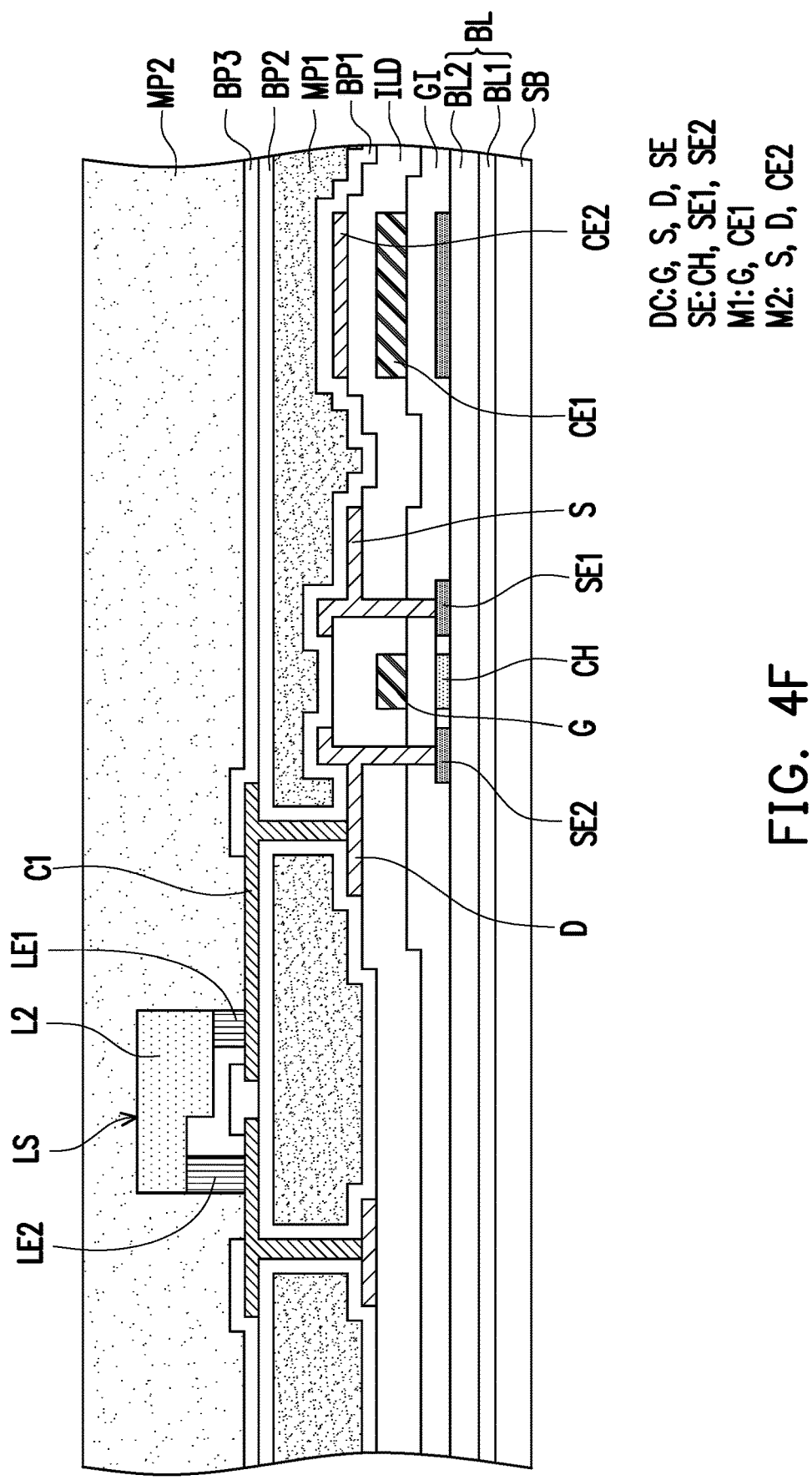
Figure 4G:
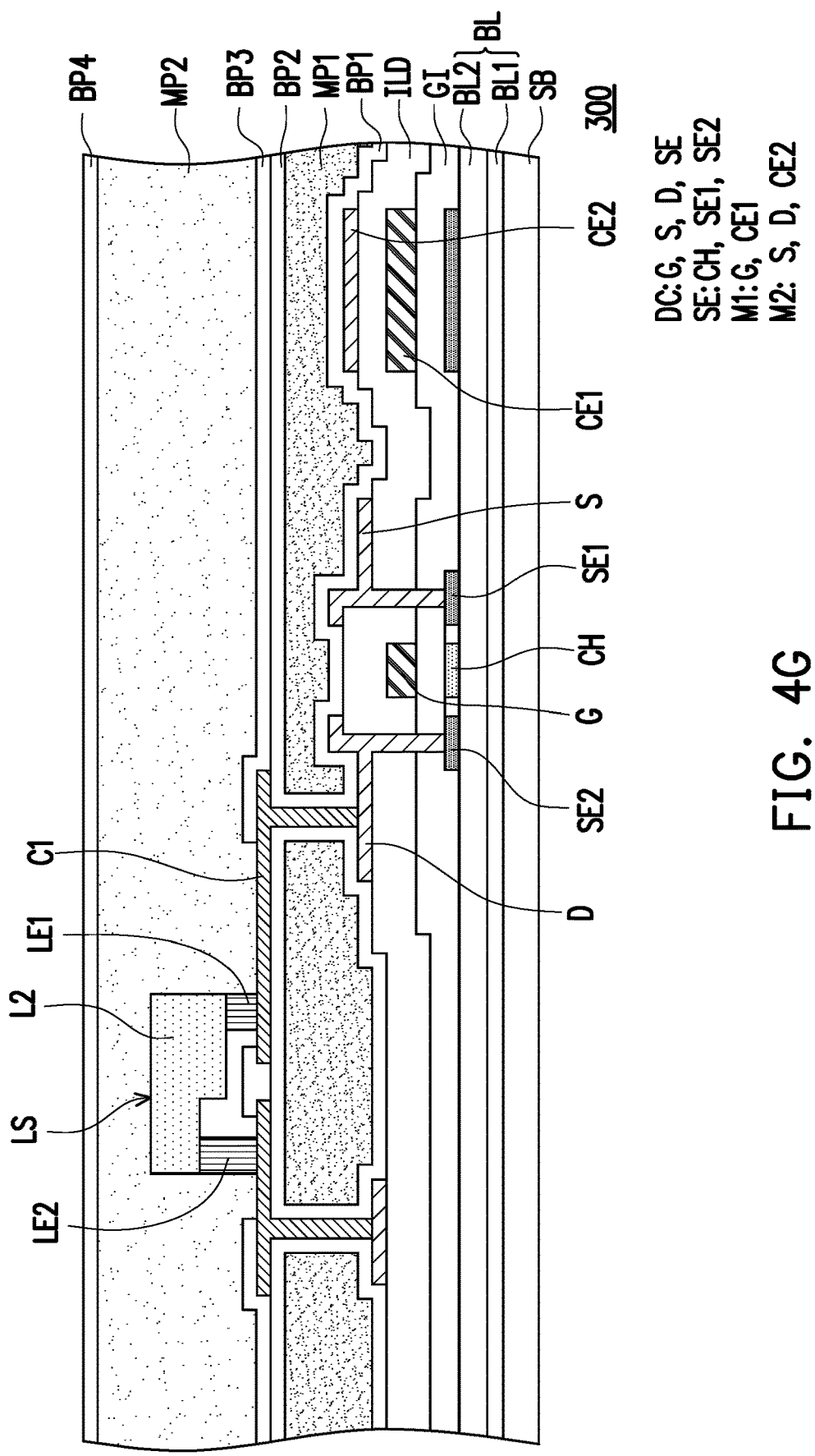

Referring to FIG. 4A to FIG. 4G at the same time, the main difference between the manufacturing method of a display panel 300 of the present embodiment and the manufacturing method of the display panel 100 of the above embodiment is: in the manufacturing process shown in FIG. 4E, a light-emitting element L2 formed is a flip-chip light-emitting diode instead of a horizontal light-emitting diode. That is, the light-emitting surface LS of the light-emitting element L2 of the present embodiment is an opposite surface to the light-emitting surface of the light-emitting element L1 of the above embodiment. Based on the above, in the present embodiment, the refractive index of the first heat dissipation layer MP1 opposite to the light-emitting surface LS of the light-emitting element L2 is less than the refractive index of the second heat dissipation layer MP2 facing the light-emitting surface LS of the light-emitting element L2. That is, the second heat dissipation layer MP2 has a refractive index between 1.8 and 2.3, so as to achieve refractive index matching with the light-emitting element L2 and have the effect of high transmittance. In contrast, the refractive index of the first heat dissipation layer MP1 is between 1.5 and 1.8, so as to achieve the effect of high reflectivity. Moreover, since the refractive index of the first heat dissipation layer MP1 is less than the refractive index of the second heat dissipation layer MP2 (because the density of microparticles included in the first heat dissipation layer MP1 is less than the density of microparticles included in the second heat dissipation layer MP2), the coefficient of thermal conductivity of the first heat dissipation layer MP1 is also less than the coefficient of thermal conductivity of the second heat dissipation layer MP2.

Based on the above, the display panel of the invention may have a lower operating temperature by arranging the light-emitting element between the first heat dissipation layer and the second heat dissipation layer to quickly dissipate the heat thereof generated during operation. Therefore, the light-emitting efficiency of the light-emitting element of the invention may be improved accordingly. Moreover, in the invention, the heat dissipation layer facing the light-emitting surface of the light-emitting element and the heat dissipation layer opposite to the light-emitting surface of the light-emitting element have the refractive index matching relationship above, respectively. In this way, the light output intensity of the light-emitting element may be increased, so as to improve the display effect of the display panel of the invention.

What is claimed is:

1. A display panel, comprising:
   a drive element disposed on a substrate;
   a first heat dissipation layer disposed on the drive element;
   a light-emitting element disposed on the first heat dissipation layer and electrically connected to the drive element; and
   a second heat dissipation layer covering the light-emitting element;
   wherein a refractive index of the first heat dissipation layer is greater than a refractive index of the second heat dissipation layer when a light-emitting surface of the light-emitting element faces the first heat dissipation layer, or
   the refractive index of the second heat dissipation layer is greater than the refractive index of the first heat dissipation layer when the light-emitting surface of the light-emitting element faces the second heat dissipation layer,
   wherein a coefficient of thermal conductivity of the first heat dissipation layer and a coefficient of thermal conductivity of the second heat dissipation layer are greater than one,
   wherein the coefficient of thermal conductivity of the first heat dissipation layer is greater than the coefficient of thermal conductivity of the second heat dissipation layer when the light-emitting surface of the light-emitting element faces the first heat dissipation layer, or the coefficient of thermal conductivity of the second heat dissipation layer is greater than the coefficient of thermal conductivity of the first heat dissipation layer when the light-emitting surface of the light-emitting element faces the second heat dissipation layer.

2. The display panel of claim 1, wherein the refractive index of the first heat dissipation layer and the refractive index of the second heat dissipation layer are between 1.5 and 2.3.

3. The display panel of claim 2, wherein,
the refractive index of the first heat dissipation layer is 1.8 to 2.3 and the refractive index of the second heat dissipation layer is 1.5 to 1.8 when the light-emitting surface of the light-emitting element faces the first heat dissipation layer; or
the refractive index of the first heat dissipation layer is 1.5 to 1.8 and the refractive index of the second heat dissipation layer is 1.8 to 2.3 when the light-emitting surface of the light-emitting element faces the second heat dissipation layer.

4. The display panel of claim 1, wherein the first heat dissipation layer and the second heat dissipation layer comprise a plurality of microparticles, and the plurality of microparticles comprise $Al_2O_3$, $TiO_2$, or a combination thereof.

5. The display panel of claim 4, wherein a density of the plurality of microparticles comprised in the first heat dissipation layer is greater than a density of the plurality of microparticles comprised in the second heat dissipation layer when the light-emitting surface of the light-emitting element faces the first heat dissipation layer, or the density of the plurality of microparticles comprised in the second heat dissipation layer is greater than the density of the plurality of microparticles comprised in the first heat dissipation layer when the light-emitting surface of the light-emitting element faces the second heat dissipation layer.

6. The display panel of claim 1, further comprising:
a first insulating layer disposed on the substrate and partially covering the drive element;
a second insulating layer disposed on the first heat dissipation layer, wherein the first heat dissipation layer is covered by a structure formed by the first insulating layer and the second insulating layer; and
a third insulating layer disposed on the second insulating layer; and
a fourth insulating layer disposed on the third insulating layer and covering the second heat dissipation layer.

7. The display panel of claim 6, wherein the second heat dissipation layer is covered by a structure formed by the third insulating layer and the fourth insulating layer.

8. The display panel of claim 6, wherein a driver chip is disposed on the fourth insulating layer and electrically connected to the drive element when the light-emitting surface of the light-emitting element faces the first heat dissipation layer.

* * * * *